(12) United States Patent
Miida

(10) Patent No.: US 6,937,525 B2
(45) Date of Patent: Aug. 30, 2005

(54) SEMICONDUCTOR MEMORY HAVING STORAGE CELLS STORING MULTIPLE BITS AND A METHOD OF DRIVING THE SAME

(75) Inventor: Takashi Miida, Kanagawa (JP)

(73) Assignee: Innotech Corporation, Kanagawa (JP)

( * ) Notice: Subject to any disclaimer, the term of this patent is extended or adjusted under 35 U.S.C. 154(b) by 212 days.

(21) Appl. No.: 10/300,027

(22) Filed: Nov. 20, 2002

(65) Prior Publication Data

US 2003/0095441 A1 May 22, 2003

(30) Foreign Application Priority Data

Nov. 22, 2001 (JP) .......................... 2001-358308
Nov. 1, 2002 (JP) .......................... 2002-319835

(51) Int. Cl.⁷ .............................. G11C 16/04
(52) U.S. Cl. ..................... 365/185.33; 365/185.26; 438/257; 438/266
(58) Field of Search ................ 365/185.33, 185.26; 438/257, 266

(56) References Cited

U.S. PATENT DOCUMENTS 6,133,098 A * 10/2000 Ogura et al. ............... 438/267
6,154,392 A * 11/2000 Patti ....................... 365/185.28
6,323,088 B1 * 11/2001 Gonzalez et al. ........... 438/257
2002/0014666 A1 2/2002 Ohmi et al.

FOREIGN PATENT DOCUMENTS

JP 3249812 B1 1/2002
JP 3283872 B1 5/2002
JP 2002208648 B1 7/2002

* cited by examiner

*Primary Examiner*—Richard Elms
*Assistant Examiner*—Toan Le
(74) *Attorney, Agent, or Firm*—Birch, Stewart, Kolasch & Birch, LLP

(57) ABSTRACT

A multiple-bit transistor includes P type semiconductor including a projection, a gate insulation layer, a pair of N type source/drain regions, tunnel insulation layers, a pair of floating gates, inter-polycrystalline insulation layers, and a control gate. The root portion of the projection, which is defined by a straight line virtually connecting the source/drain regions, is higher in the concentration of the P type impurity than the other portion. A potential difference for write-in is set up between the source/drain regions while a write voltage is applied to the control gate, thereby causing electrons to be ballistically injected into at least one of the floating gates.

31 Claims, 33 Drawing Sheets

US 6,937,525 B2

SEMICONDUCTOR MEMORY HAVING STORAGE CELLS STORING MULTIPLE BITS AND A METHOD OF DRIVING THE SAME

This nonprovisional application claims priority under 35 U.S.C. § 119(a) on Patent Application No. 2001-358308 filed in JAPAN on Nov. 22, 2001 and 2002-319835 filed in JAPAN on Nov. 1, 2002, which is herein incorporated by reference.

BACKGROUND OF THE INVENTION

1. Field of the Invention

The present invention relates to a multiple-bit transistor, a semiconductor memory using the same, and a method of driving a multiple-bit transistor. More particularly, the present invention relates to a technology useful for a semiconductor memory having storage cells each storing multiple bits.

2. Description of the Background Art

Today, nonvolatile memories including EEPROMs (Electrically Erasable Programmable Read Only Memories) are widely applied to, e.g. mobile telephones. An EEPROM, for example, usually allows only one bit of information to be stored in each storage cell transistor. However, to promote size reduction of the device, there should preferably be implemented the multiple-bit configuration of a cell transistor that allows two or more bits of information to be stored in the cell transistor.

FIG. 26 of the drawings shows a storage cell transistor with a multiple-bit configuration taught in U.S. Pat. No. 6,011,725 by way of example. As shown, the cell transistor, generally 1, has a so-called MONOS (Metal Oxide Nitride Oxide Semiconductor) structure made up of a control gate electrode (metal) 7, a silicon oxide layer (oxide) 6, a silicon nitride layer (nitride) 5, a silicon oxide layer (oxide) 4, and a P type silicon substrate (semiconductor) 2 in the order.

In the cell transistor 1, N type source/drain regions 3 and 8 each selectively become a source or a drain electrode at various stages of a write-in or a read-out sequence. Stated another way, it is indefinite which of the source/drain regions 3 and 8 functions as a source or a drain electrode. In the following description, one of the source/drain regions 3 and 8 that discharges an electric carrier, which may be electrons in this specific case, and the other region will be referred to as a source and a drain region, respectively.

FIG. 27A demonstrates how data is written to the storage cell transistor 1. As shown, the source region 8 is grounded while suitable positive voltages $V_{D1}$ and $V_{G1}$ are applied to the drain region 3 and control gate 7, respectively. In this condition, an electric field is established between the source region 8 and the drain region 3 and accelerates electrons, so that hot electrons are generated in the vicinity of the drain region 3. The hot electrons thus generated are injected into the silicon nitride layer 5 over the energy barrier of the silicon oxide layer 4 due to the collision thereof against phonons and the positive potential of the control gate electrode 7. Because the silicon nitride layer 5 is not electrically conductive, the hot electrons injected into the silicon nitride layer 5 localize in the vicinity of the drain region 3, forming a right bit 9a of information stored. This condition is representative of a stored-bit state (1, 0).

FIG. 27B shows a condition wherein the source and drain voltages of FIG. 27A are replaced with each other. As shown, the hot electrons injected into the silicon nitride layer 5 localize in the vicinity of the drain region 8, forming a left bit 9b of information stored. This sets up a storage state (0, 1).

FIGS. 28A through 28D show four different logical storage states available with the cell transistor 1. As shown in FIG. 28A, when electrons are not stored in either one of the right and left positions, a state (1, 1) is set up. As shown in FIG. 28D, when electrons are stored in both of the right and left bit positions, a state (0, 0) is set up. In this manner, the cell transistor 1 allows two-bit data to be stored therein. However, this data writing sequence is undesirable because the hot electrons cannot be injected into the silicon nitride layer 5 unless the voltage $V_{G1}$ applied to the control gate 7 is high.

More specifically, for the injection of hot electrons, it is necessary to tunnel hot electrons from the conduction band of the silicon substrate 2 to the conduction band of the silicon oxide layer 4. An energy difference between those two conduction bands is about 3.2 electron volts (eV). However, the hot electrons lose energy on colliding against phonons present in the silicon substrate 2 and cannot be tunneled between the two conduction bands mentioned above even if a voltage of 3.2 V is applied to the control gate 7. In practice, therefore, the voltage $V_{G1}$ applied to the control gate 7 must be as high as 12 V to 13 V.

While the above-stated high voltage is expected to be applied to the control gate 7 from a highly voltage-resistant transistor included in a decoder circuit, not shown, such a transistor cannot be miniaturized because miniaturization would cause punch-through to occur between the source and drain electrodes of the transistor. There is therefore a problem that it is impossible with the prior art structure described above to reduce the chip size of the entire EEPROM including the decoder circuit.

On the other hand, to read out the data from the cell transistor 1, the voltages applied to the source region 8 and drain region 3 are replaced with each other from write-in condition to measure a drain current while each drain current measured is compared with a reference current value, as will be described more specifically hereinafter. In the state (0, 0) shown in FIG. 28D, electrons localize at both of the right and left bit positions, so that the potential of the silicon nitride layer 5 is lowest among the four states. Consequently, the threshold voltage of the cell transistor 1 becomes highest and causes substantially no drain current to flow. The value of the drain current remains the same even when the voltages applied to the source region 8 and drain region 3 are replaced, and is almost zero. As a result, the two drain currents sequentially measured both are determined to be greater than the reference current.

In the state (1, 1) shown in FIG. 31A, electrons are absent from both of the right and left bit positions 9a and 9b, so that the potential of the silicon nitride layer 5 is highest among the four states. Therefore, the threshold voltage of the transistor 1 becomes lowest among the four states, causing the greatest drain current to flow. The value of the drain current remains the same even when the source region 8 and drain region 3 are replaced with each other, and is greatest among the four states. As a result, the drain currents measured one after the other are both determined to be greater than the reference current.

On the other hand, in the states (1, 0) and (0, 1) shown in FIGS. 28B and 28C, respectively, electrons localize at only one of the right and left bit positions, making the cell transistor 1 asymmetrical in the right-and-left direction with respect to potential distribution. The drain currents sequentially measured are different from each other when the voltages applied to the source region 8 and drain region 3 are replaced. It is therefore possible to distinguish the states (1, 0) and (0, 1) by determining which of the two drain currents is greater or smaller than the reference current.

The data reading sequence described above has a drawback that the current window for distinguishing the drain currents is smaller when the state (1, 0) or (0, 1) is sensed. A current window refers to a difference between the two drain currents measured by replacing the voltages applied to the source and drain regions 3 and 8 in the event of sensing the states (1, 0) and (0, 1). The current window definitely opens when electrons distinctly localize at the right or left end of the silicon nitride layer 5, i.e. when the cell transistor 1 is clearly asymmetrical in the right-and-left direction in potential or electron distribution.

Asymmetry, however, does not clearly appear in the cell transistor 1 because electrons are distributed in the silicon nitride layer 5 over some breadth. Particularly, when a gate length L, see FIG. 27A, is reduced for reducing the cell size, it is not clear at which of the right and left bit positions electrons localize, further reducing the asymmetry of the cell transistor 1 and therefore the current window. Such a small current window reduces the margins of the drain and reference currents and thereby aggravates incorrect identification of written data.

Another problem with the conventional transistor 1 is that resistance to inter-band tunneling is low, as will be described hereinafter with reference to FIG. 29. FIG. 29 shows a condition wherein the cell transistor 1 is not selected. As shown, to make the cell transistor 1 unselected, a ground potential lower than the potential assigned to read-out is applied to the control gate 7. On the other hand, the positive potential $V_{D1}$ is applied to the drain electrode of a cell transistor selected. Because the positive potential $V_{D1}$ is common to all of the cells in the direction of column of the memory device, it is applied to the drain region 3 of the cell transistor 1 as well.

In the condition shown in FIG. 29, a potential difference ΔV between the silicon nitride layer 5 and the drain region 3 is greater than in the case of read-out because the potential of the control gate 7 is lowered. Particularly, when electrons localize in the silicon nitride layer 5, the potential difference ΔV further increases because the electrons lower the potential of the silicon nitride layer 5. If the potential difference ΔV is great, then a tunnel current flows between the drain region 3 and the silicon nitride layer 5 and causes the silicon oxide layer 4 to deteriorate.

Moreover, a great potential difference ΔV produces a stronger electric field at the edge of the drain region 3, so that breakdown is apt to occur at the PN junction of the drain region 3 and silicon substrate 2. The breakdown causes hot holes and electrons to appear in pairs, as shown in an enlarged view in a circle 100. The hot holes 102 are attracted toward the lower potential side (the silicon nitride layer 5 side) and therefore passed through the silicon oxide layer 4, deteriorating the layer 4. The low resistance to inter-band tunneling mentioned earlier refers to the circumstances described above.

To delete data stored in the cell transistor 1, electrons stored in the silicon nitride layer 5 are withdrawn toward the drain electrode 3, as shown in FIG. 30A, or toward the control gate 7, as shown in FIG. 30B. More specifically, in FIG. 30A, a negative potential "L" and a positive potential "H" are applied to the control gate 7 and drain electrode 3, respectively, so that the electrons are withdrawn toward the drain electrode 3 higher in potential than the control gate 7. In FIG. 30B, a positive potential "H" is applied to the control gate 7 while the drain electrode 3 is grounded, so that the electrons are withdrawn toward the control gate 7 higher in potential than the drain electrode 3 and a tunnel current 104 flows.

SUMMARY OF THE INVENTION

It is an object of the present invention to provide a multiple-bit transistor operable with a lower write voltage than the conventional multiple-bit transistor, a semiconductor memory using the same, and a method of driving a multiple-bit transistor.

In accordance with the present invention, a transistor includes a one-conductivity type semiconductor substrate formed with a projection having a pair of side walls facing each other. A first insulation layer is formed on the top of the projection. A pair of counter-conductivity type source/drain regions is formed on the surface of the semiconductor substrate at opposite sides of the projection. Second insulation layers each cover one of the side walls of the projection and one of the source/drain regions. A pair of floating gates are respectively formed the side walls of the projection and respectively face the side walls and source/drain regions via the respective second insulation layers. Third insulation layers each are formed on one of the floating gates. A control gate faces the floating gates via the third insulation layers and faces the top of the projection via the first insulation layer. The root portion of the projection, which is defined by a straight line virtually connecting the source/drain regions, is higher in the concentration of the one-conductivity type impurity than the remainign portion. A potential difference for write-in is set up between the source/drain regions while a write voltage is applied to the control gate, thereby causing a charge to be ballistically injected into at least one of the floating gates.

Alternatively, a charge to flow between the source/drain regions may comprise electrons, which obtain energy greater than a potential barrier of the second insulation layers and are ballistically injected into at least one of the floating gates.

Further Alternatively, a first capacitance is formed by the floating gates each facing one side wall of the projection and one source/drain region via a particular second insulation layer, and a second capacitance is formed by the control gate facing the top of the projection via the first insulation layer. The first capacitance may be greater than the second capacitance.

Alternatively, a third capacitance is formed by each of the floating gates facing the control gate via the one of the third insulation layer. The first capacitance may be capacitively coupled to the third capacitance, and the first capacitance is great.

Advantageously, each of the counter-conductivity type regions may be formed on one of the side walls of the projection in contact with the source/drain region adjoining the side wall.

Also, each of the floating gates at least partly may protrude above the top of the projection.

Further, the floating gates may be configured such that the floating gates do not cover the top of the projection.

A semiconductor memory is also provided which includes a plurality of cell transistors each having the above-stated configuration.

Alternatively, the cell transistors adjoining each other in the direction of column may share a single source/drain region, and the cell transistors adjoining each other in the direction of row share a single control gate and the source/drain region between the cell transistors.

Advantageously, a capacitor is selectively connectable to either one of the pair of source/drain regions, and a write current is caused to continuously flow between the pair of source/drain regions until a preselected amount of charge has been stored in or released from the capacitor, thereby causing a charge to be ballistically charged into at least one of the pair of floating gates.

Further, in accordance with the present invention, a method of driving a transistor having the above-stated configuration, comprises the steps of setting up a potential difference for write-in between the pair of source/drain regions, applying a write voltage to the control gate, and ballistically injecting a charge into at least one of the pair of floating gates for thereby writing data in the at least one floating gate.

BRIEF DESCRIPTION OF THE DRAWINGS

The objects and features of the present invention will become more apparent from consideration of the following detailed description taken in conjunction with the accompanying drawings in which.

DESCRIPTION OF THE PREFERRED EMBODIMENT

Figure 1:
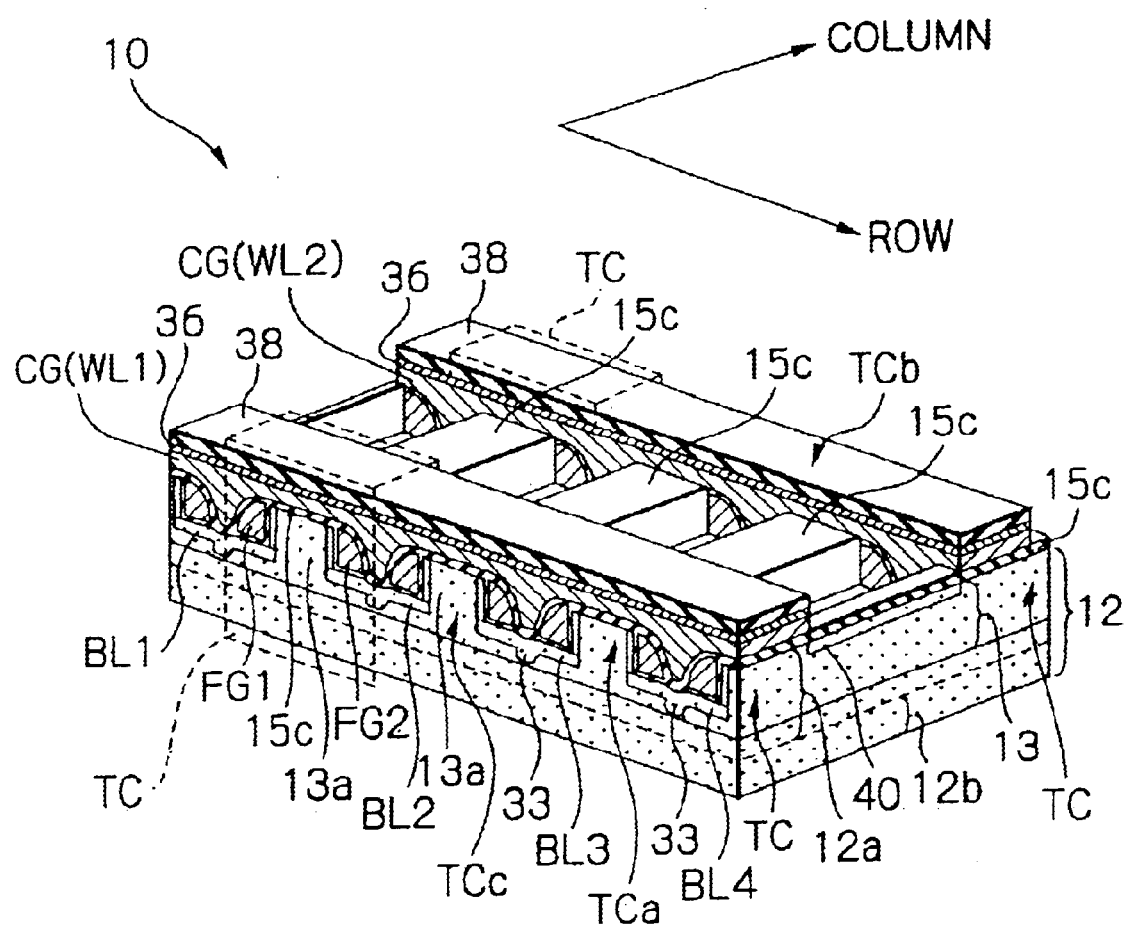
FIG. 1 is a fragmentary perspective view of a semiconductor memory embodying the present invention.

Referring to FIG. 1 of the accompanying drawings, part of a semiconductor memory embodying the present invention is generally designated by the reference numeral 10. In the following description, identical reference numerals designate like elements. Signals are designated by reference numerals attached to signal lines on which they appear. As shown, the semiconductor memory 10 is formed on a P type silicon substrate 12, which is a one-conductivity type semiconductor substrate. The P type silicon substrate 12 is made up of a P+ substrate 12b and a P type epitaxial layer 12a formed on one primary surface of the P+ substrate 12b. A P type well 13 is formed in the P type epitaxial layer 12a.

A plurality of projections or ridges 13a, which are unique to the present invention, protrude from the major surface of the P type silicon substrate 12. Bit lines BL1 through BL4 are formed on the surface of the P type well 13 at both sides of the projections 13a. More specifically, ions of an N type impurity, opposite in conductivity type to the P type well 13, are implanted in the surface of the P type well 13 at positions expected to form the bit lines BL1 through BL4. The bit lines BL1 through BL4 are arranged side by side in the direction of row of a memory cell array while extending in the direction of column each, although hidden by the other structural members and not clearly visible in the figure.

Floating gates FG1 and FG2 and a control gate CG are formed of polycrystalline silicon. More specifically, a plurality of control gates CG are arranged in the direction of column while extending in the direction of row each. The control gates CG respectively play the role of word lines WL1, WL2 and so forth. Tungsten silicon (WSi) layers 36 each serve to lower the resistance of particular one of the control gates CG while cap layers 38 each protect the control gate CG. The cap layers 38 are formed of silicon oxide.

Figure 2:
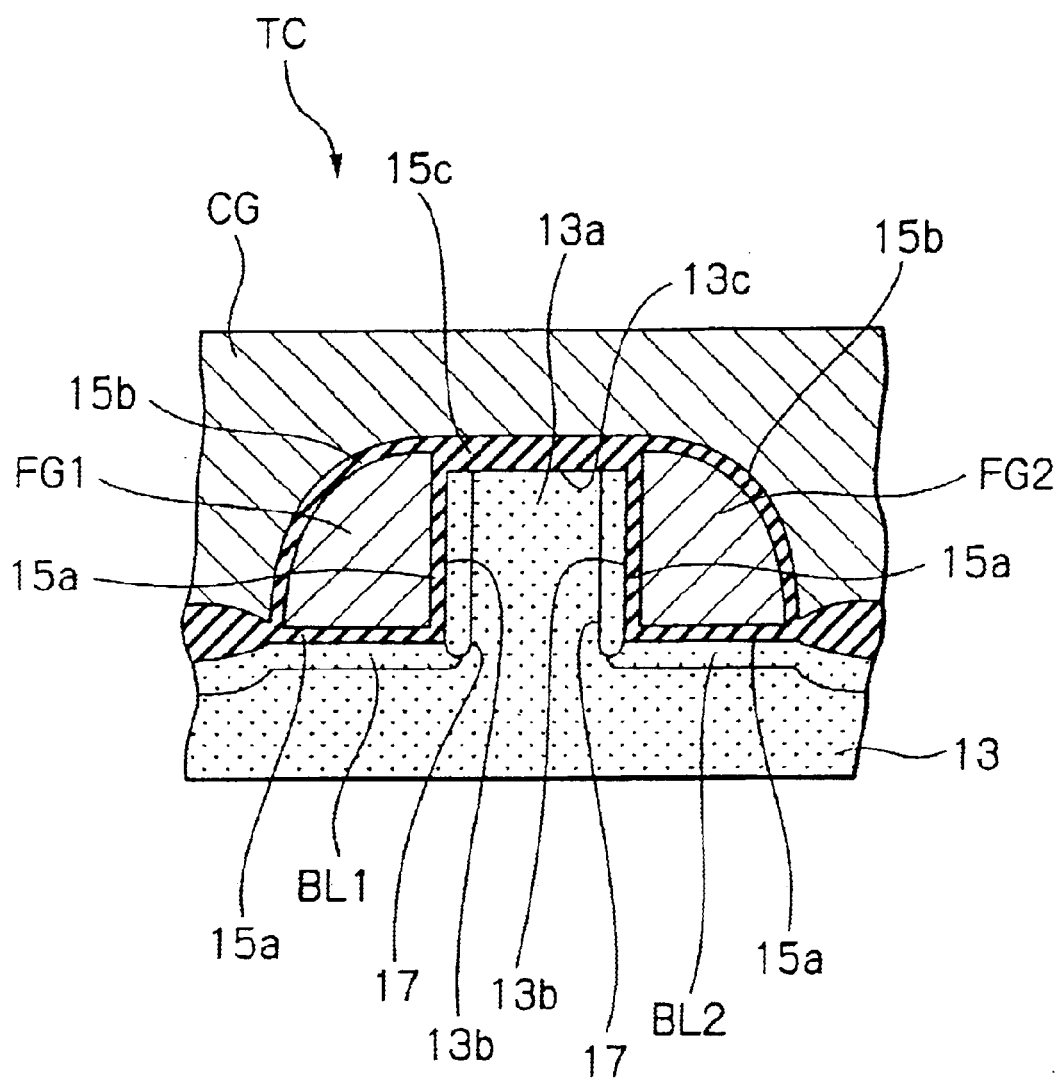
FIG. 2 shows an enlarged section of one of cell transistors included in the semiconductor memory of FIG. 1.

FIG. 2 is an enlarged view showing a cell transistor TC characterizing the present invention. As shown, the cell transistor TC includes the previously mentioned projection 13a and a gate insulation layer or first insulation layer 15c formed on the top 13c of the projection 13a. The projection 13a has a pair of side walls 13b opposite to each other on which are formed counter-conductivity type, N type, regions 17 opposite in conductivity type to the projection 13a. The impurity concentration of the N type regions 17 is selected to fall between $\frac{1}{100}$ and $\frac{1}{10,000}$, preferably about $\frac{1}{1,000}$, as high as that of the bit lines BL1 and BL2.

Tunnel insulation layers or second insulation layers 15a respectively cover one of the side walls 13b and bit line BL1 and the other side wall 13b and bit line BL2. The bit lines BL1 and BL2 bifunction as source/drain regions, as will be described specifically later. In this sense, the bit lines BL1 and BL2 will be sometimes referred to as source/drain regions.

The floating gates FG1 and FG2 respectively face the source/drain regions BL1 and BL2 and the opposite side walls 13b of the projection 13a via the tunnel insulation layers 15a adjoining them. Inter-polycrystalline insulation layers or third insulation layers 15b each are formed on one of the floating gates FG1 and FG2. The tunnel insulation layers 15a, inter-polycrystalline insulation layers 15b and gate insulation layer 15c all are formed of silicon oxide.

The control gate CG at least partly faces the floating gates FG1 and FG2 via the inter-polycrystalline insulation layers 15b and partly faces the top 13c of the projection 13a via the gate insulation layer 15c. Alternatively, the control gate CG may comprise segments facing the floating gates FG1 and FG2 with the inter-polycrystalline insulation layer 15b intervening in between and a segment facing the top surface 13c with the gate insulation layer 15c intervening in between, those segments being electrically separate from and electrically controlled independently of each other.

In the structure shown in FIG. 2, a channel region is formed on the surface layers of the opposite side walls 13b and top 13c of the projection 13a in a tridimensional configuration. This is contrastive to a conventional channel region that was formed in a single plane. Therefore, the cell transistor TC achieves a longer channel length while occupying a minimum of area and can therefore reduce the size of a memory device.

The P type impurity of the projection 13a has a concentration adjusted such that the cell transistor TC normally remains in its non-conductive or OFF state. More specifically, assume a condition wherein a preselected voltage is applied to the source/drain region BL1 or BL2. Then the concentration of the P type impurity is adjusted such that when a potential difference between the so biased source/drain region BL1 or BL2 and the control gate CG is lower than a threshold voltage, the channel region established in the vicinity of the top of the ridge 13a in response to the control gate CG via the gate insulation layer 15c goes to its non-conductive state to resultantly render the cell transistor TC non-conductive, or when the potential difference is equal to or higher than the threshold voltage, the transistor TC goes conductive. It is to be noted that the preselected voltage applied to the source/drain region BL1 or BL2 refers to a voltage $V_{DD}$ necessary for write-in, read-out and other various operations, as will be described in detail later.

Figure 3:
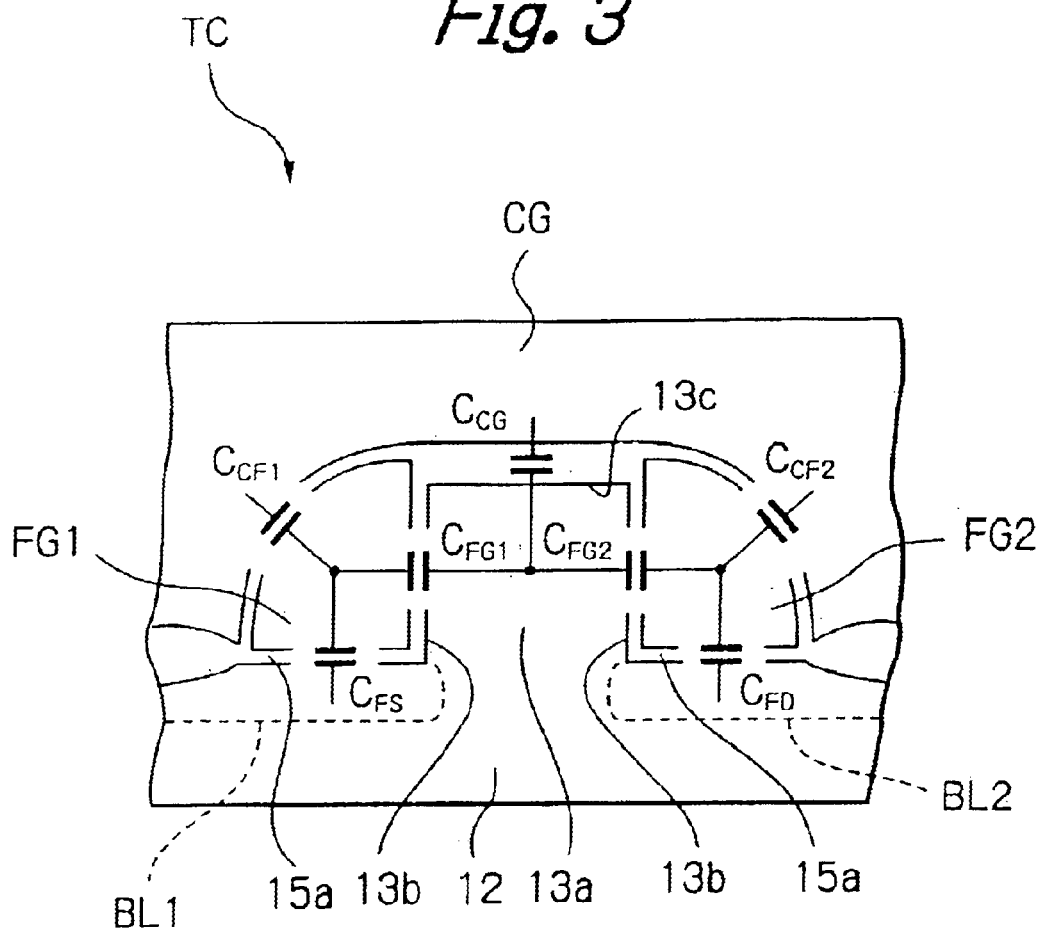
FIG. 3 shows an equivalent circuit representative of the cell transistor of FIG. 2.

FIG. 3 shows an equivalent circuit representative of the cell transistor TC and including various capacitances associated therewith. The capacitance is represented by a capacitor $C_{CG}$ between the control gate CG and the top 13c of the projection 13c facing each other, a capacitor $C_{CF1}$ ($C_{CF2}$) between the control gate CG and the floating gate FG1 (FG2) facing each other, a capacitor $C_{FG1}$ ($C_{FG2}$) between the floating gate FG1 (FG2) and the source/drain region BL1 (BL2) facing each other, and a capacitor $C_{FS}$ ($D_{FD}$) between the floating gate FG1 (FG2) and the source/drain region BL1 (BL2) facing each other.

Referring again to FIG. 1, a plurality of cell transistors TC are arranged side by side in both of the directions of column and row. The cell transistors TC adjoining each other in the direction column, e.g. cell transistors $TC_a$ and $TC_b$ share the source/drain regions BL3 and BL4, but are electrically isolated from each other by an isolation region 40. On the other hand, cell transistors $TC_c$ and $TC_a$, for example, adjoining each other in the direction of row share the control gate CG and share the source/drain region BL3 between them.

Figure 4:
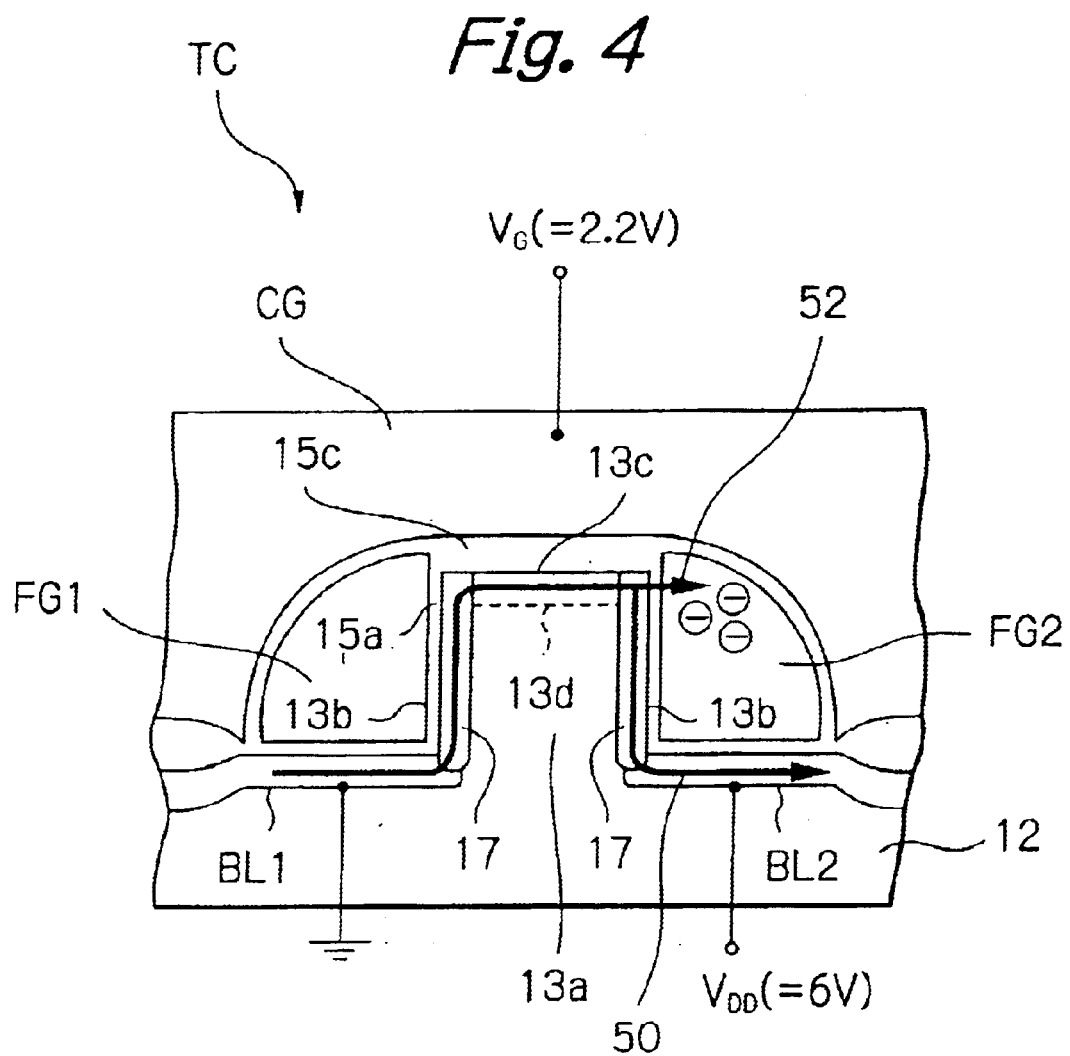
FIG. 4 shows a section demonstrating a write mode for writing data in the cell transistor of the illustrative embodiment.

A method of driving the individual cell transistor TC will be described hereinafter. First, reference will be made to FIG. 4 for describing how two-bit data is written to the cell transistor TC. In the illustrative embodiment, electrons can be selectively injected into either one of the floating gates FG1 and FG2, which are positioned at both sides of the projection 13a. As shown in FIG. 4, to inject electrons into the right floating gate FG2 by way of example, a gate voltage $V_G$ of, e.g. 2.2 V is applied to the control gate CG while a voltage $V_{DD}$ of, e.g. 6 V is applied to the source/drain region BL2 in the side of the floating gate FG2 into which electrons should be injected. At the same time, the substrate 12 and the other source/drain region BL1 are grounded. Consequently, a potential difference for write-in, which is 6 V in the illustrative embodiment, is applied between the source/drain regions BL1 and BL2.

In the condition shown in FIG. 4, the positive potential applied to the control gate CG causes an inversion layer 13d to be formed on the surface of the top 13c of the projection 13c. As a result, the N type regions 17 are electrically interconnected by the inversion layer 13d. Because the N type regions 17 each are contiguous with one of the N type source/drain regions BL1 and BL2, the N type source/drain regions BL1 and BL2 themselves are electrically interconnected. Consequently, a carrier, electrons in the illustrative embodiment, flows through a path indicated by arrows 50 and 52.

Paying attention to electrons flowing along the top 13c, among others, the floating gate FG2 is positioned just at the right-hand side in the direction of the flow in the figure. Those electrons can therefore be injected straightforward into the floating gate FG2 without being steered as in the conventional structure. This allows the gate voltage (write voltage) $V_G$ for attracting the electrons toward the floating gate FG2 to be made lower than the conventional gate voltage. In addition, the potential of the floating gate FG2 is raised by the drain voltage via the gate insulation layer 15a having larger capacity, so that the gate voltage or write-in voltage $V_G$ for attracting the electrons toward the floating gate FG2 can be further lowered.

Moreover, the N type regions 17 formed on the side walls 13b of the projection 13a serve to lower the resistance of the side walls 13b for thereby obstructing voltage drop across the side walls 13b. Consequently, a voltage substantially equal to a voltage of, e.g. 6 V between the source/drain regions BL1 and BL2 is applied to the opposite ends of the top 13c, causing the top 13c to forcibly accelerate the electrons. As a result, the electrons are efficiently injected into the floating gate FG2, as indicated by the arrow 52 in FIG. 4. In this manner, the N type regions 17 also serve to lower the write voltage $V_G$.

The above advantage is achievable even when channel resistance at the top 13c is increased. The channel resistance can be increased if the thickness of the gate insulation layer 15c is increased to reduce capacitance between the control gate CG and the channel region. In the illustrative embodiment, as shown in FIG. 4, the gate insulation layer 15c is made thicker than the tunnel insulation layers 15a for such a purpose.

Figure 5:
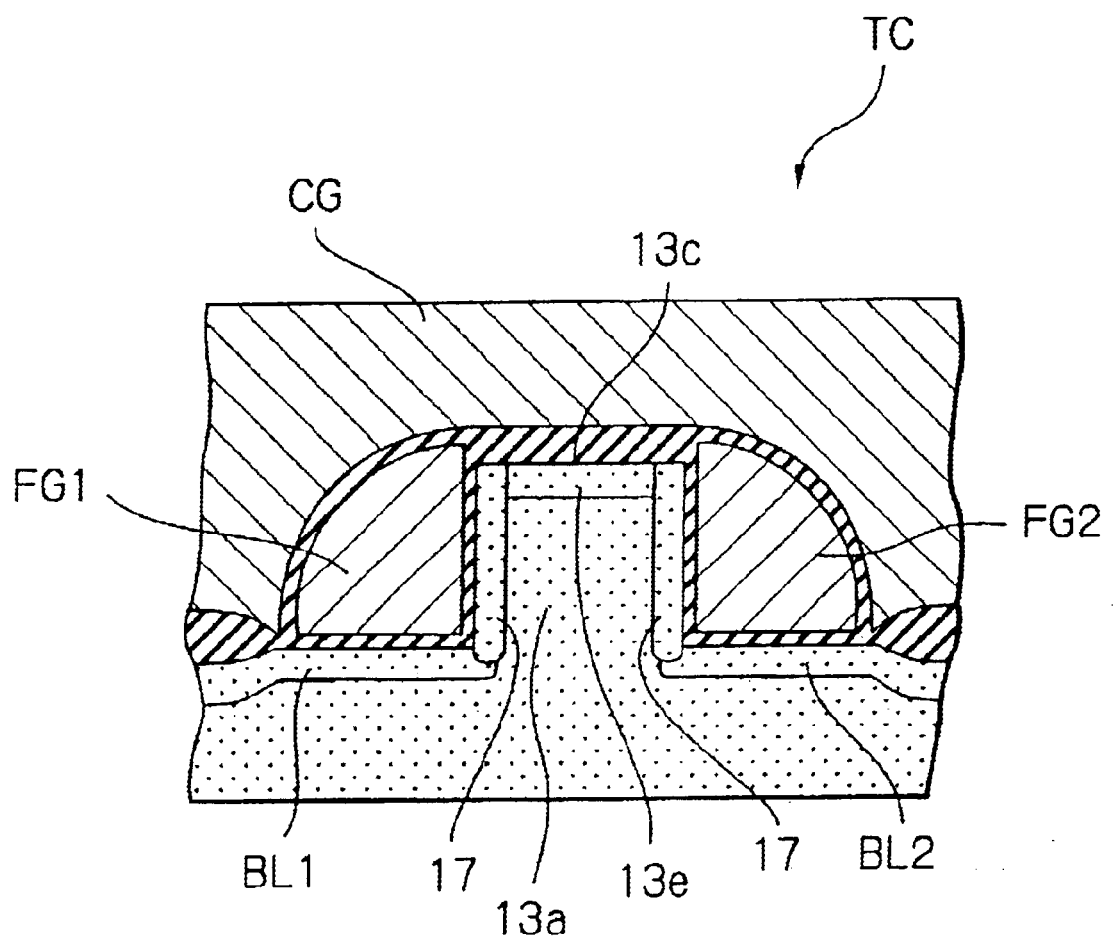
FIG. 5 shows a section of the cell transistor provided with a high-resistance region on the top of a projection.

FIG. 5 shows another specific structure for increasing the channel resistance at the top 13c. As shown, a high-resistance region 13e, which is a one-conductivity type impurity region, is formed on the top 13c of the projection 13a. To form the high-resistance region 13e, ions of a P type impurity are implanted in the top 13c to a higher concentration than that of the projection 13a When the channel resistance at the top 13c is increased, as shown in FIGS. 4 or 5, voltage drop at the top 13c increases with the result that a voltage slightly lower than the voltage between the source/drain regions BL1 and BL2 is applied to the opposite ends of the top 13c. Consequently, there can be lowered the write voltage $V_G$ for the same reason as stated above.

As stated above, the write voltage VG can be lowered i) if the N type regions are formed on the side walls 13b, ii) if the thickness of the tunnel insulation layer is increased to raise the floating gate in potential with the drain voltage, iii) if the thickness of the gate insulation layer 15c is increased, or iv) if the high-resistance region 13e is formed on the top 13c. These different schemes i) through iv) may be suitably combined, if desired, to attain the intended advantages described above. In any case, the write voltage $V_G$ should only be about 2.2 V, which is far lower than the conventional write voltage of about 12 V to 13 V.

Figure 6A:
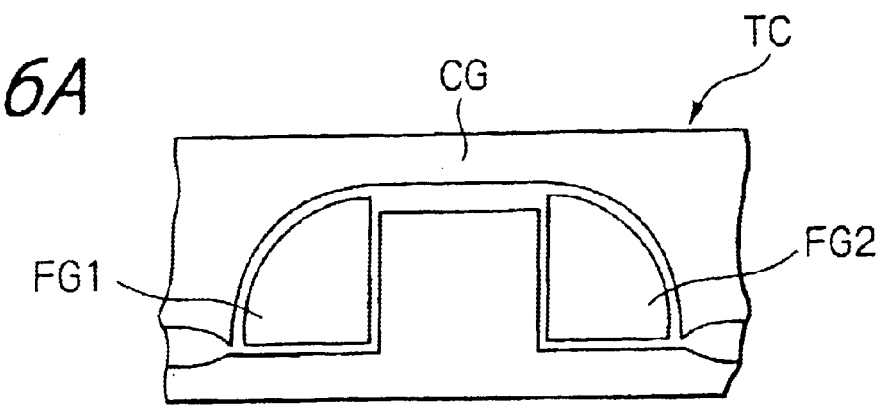
FIGS. 6A through 6D are sections showing four different states achievable with the cell transistor of the illustrative embodiment.
Figure 6B:
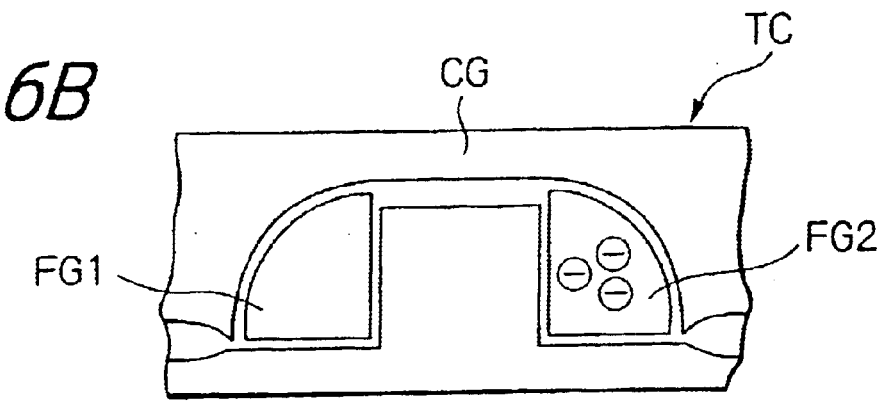
Figure 6C:
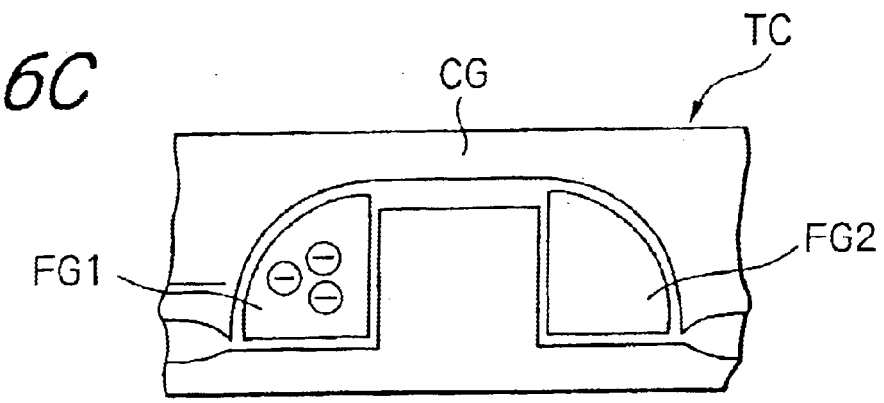
Figure 6D:
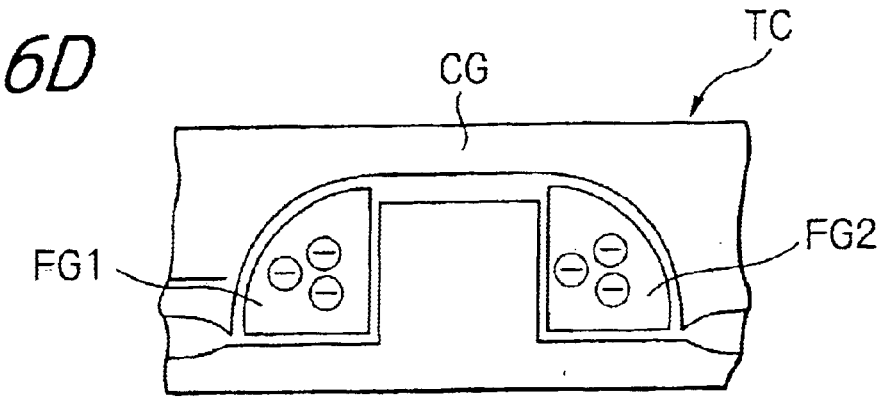

While in FIG. 4 electrons are injected into the right floating gate FG2, electrons can be injected into the left floating gate FG1 only if the voltages applied to the source/drain regions BL1 and BL2 are replaced with each other. The illustrative embodiment therefore implements four different states shown in FIGS. 6A through 6D. FIG. 6A shows a stored-bit state (1, 1) in which electrons are not injected into either one of the floating gates FG1 and FG2. FIGS. 6A and 6B respectively show storage stages (1, 0) and (0, 1) in each of which electrons are injected into either one of the floating gates FG1 and FG2. FIG. 6D shows a state (0, 0) in which electrons are injected into both of the floating gates FG1 and FG2; for example, electrons may be injected into the right floating gate FG2 and then injected into the left floating gate FG1. In this manner, the illustrative embodiment allows two-bit data (1, 1) through (0, 0) to be selectively written to a single cell transistor TC.

The illustrative embodiment includes two floating gates FG1 and FG2 and allows electrons to exist in the gates FG1 and FG2 separately from each other, as stated above. Therefore, even in an application in which the cell size is reduced, it is definitely distinguishable which of the floating gates FG1 and FG2 electrons includes significant electrons, compared to the prior art structure.

Figure 7A:
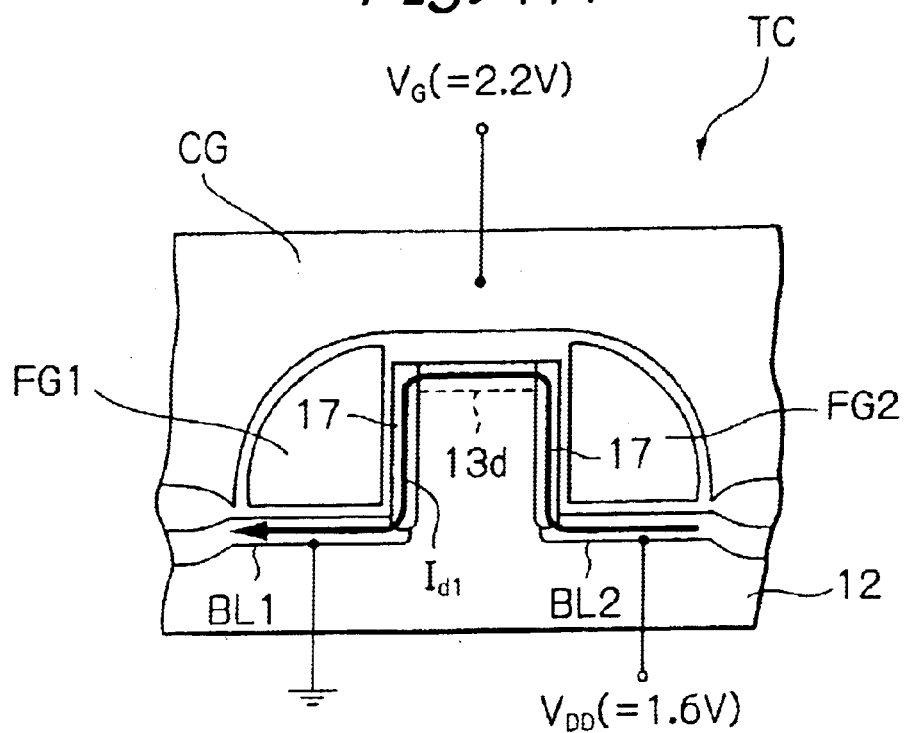
FIGS. 7A and 7B show sections in a read mode for reading out data from the cell transistor of the illustrative embodiment.
Figure 7B:
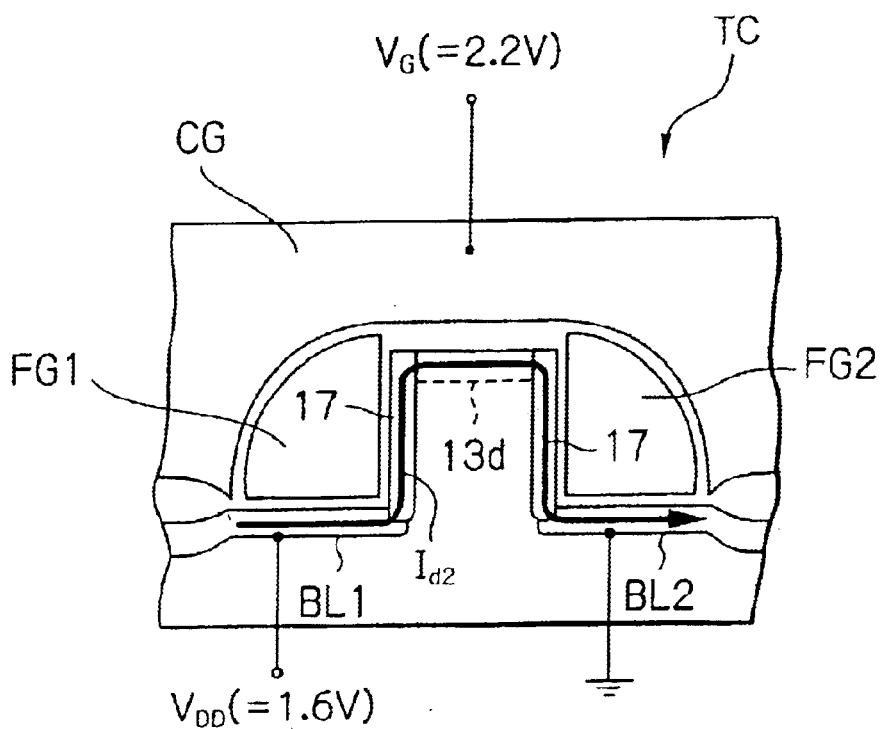

Reference will be made to FIGS. 7A and 7B for describing how two-bit data are read out from the individual cell transistor TC. First, as shown in FIG. 7A, the gate voltage $V_G$ of, e.g. 2.2 V is applied to the control gate CG. Subsequently, the voltage $V_{DD}$ of, e.g. 1.6 V is applied to one source/drain region BL2 while the other source/drain region BL1 and substrate 12 are connected to ground, i.e. a reference potential. As a result, a potential difference, which is 1.6 V in the illustrative embodiment, is applied between the source/drain regions BL1 and BL2. In the resulting potential distribution, the potential of the control gate CG is positive with the result that the inversion layer 13d is formed on the top 13c of the projection 13. Consequently, a drain current $I_{d1}$ flows in a direction indicated by an arrow in FIG. 7A.

Subsequently, as shown in FIG. 7B, the voltages applied to the source/drain regions BL1 and BL2 are replaced with each other with the gate voltage $V_G$ of 2.2 V being maintained the same. As a result, the potential difference between the source/drain regions BL1 and BL2 is inverted, causing a second drain current $I_{d2}$ to flow in a direction indicated by an arrow in FIG. 7B.

In the illustrative embodiments, the drain currents $I_{d1}$ and $I_{d2}$ are measured due to the replacement of the voltages applied to the source/drain regions BL1 and BL2. The values of the drain current $I_{d1}$ and $I_{d2}$ are different in accordance with the state, as will be described specifically later. It is therefore possible to compare the current sets ($I_{d1}$, $I_{d2}$) with the states one-to-one to determine which of the states the cell is. Drain currents to flow at the different states (1, 1) through (0, 0) will be described in detail hereinafter.

Figure 8A:
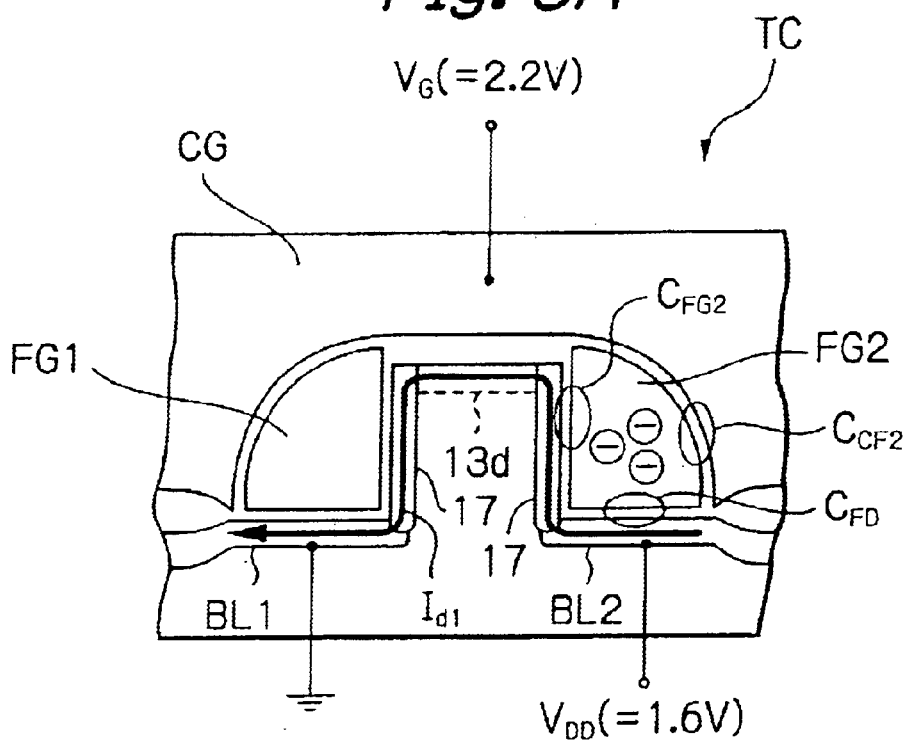
FIGS. 8A and 8B show sections useful for understanding how a state (0, 1) is sensed out of the cell transistor of the illustrative embodiment.
Figure 8B:
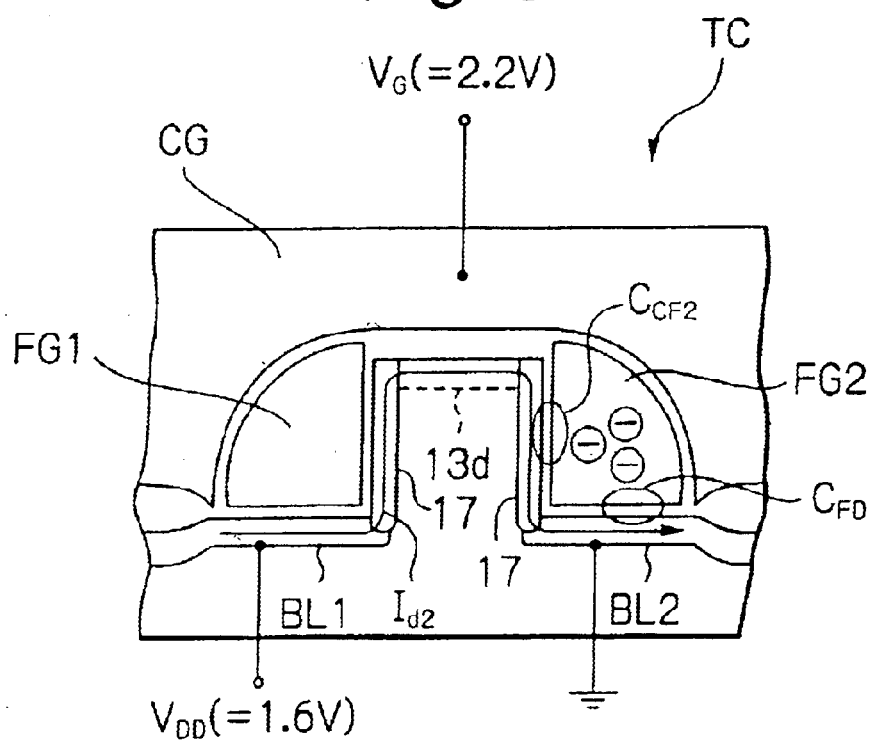

FIGS. 8A and 8B demonstrate how the state (1, 0) is sensed from the cell transistor TC. As shown in FIG. 8A, voltages are applied to the structural members of the cell transistor TC in the same manner as in FIG. 7A, causing the drain current $I_{d1}$ to flow. In this condition, although the potential of the right flowing gate FG2 is lowered due to electron injection, it is raised by the capacities $C_{CF2}$ and $C_{FD}$ toward the positive potential of the control gate CG (2.2 V) and that of the source/drain BL2 (1.6 V). Consequently, the potential drop of the floating gate FG2 is limited, so that channel resistance around the gate FG2 is not so high. The drain current $I_{d1}$ therefore has a relatively great value.

Particularly, the N type region 17 contacting the source/drain region BL2 has a potential substantially equal to the potential of the source/drain region BL2. The potential of the floating gate FG2 is therefore raised toward the source/drain BL side by the capacity CFG2 as well, further lowering channel resistance around the gate FG2. As a result, the value of the drain current $I_{d1}$ further increases.

Subsequently, as shown in FIG. 8B, the voltages applied to the source/drain regions BL1 and BL2 are replaced with each other to cause the drain current $I_{d2}$ to flow. In this case, the potential of the right floating gate FG2 is lowered due to electron injection. Further, because the right source/drain region BL2 is connected to ground, the potential of the floating gate FG2 is lowered toward the ground by the capacitance CFD between the gate FG2 and the region BL2. Consequently, the potential of the floating gate FG2 is lower in FIG. 8B than in FIG. 8A and causes channel resistance around the gate FG2 to increase. The drain current $I_{d2}$ is therefore smaller than the previous drain current $I_{d1}$.

Particularly, the N type region 17 causes the potential of the right floating gate FG2 to be lowered toward the ground by the capacitance CFG2 as well, so that the value of the drain current $I_{d2}$ is further reduced. As stated above, the state (1, 0) can be identified on the basis of ($I_{d1}$, $I_{d2}$)=(large, small). To identify greater one of the drain currents $I_{d1}$ and $I_{d2}$, a sense amplifier, not shown, associated with the memory circuit compares each of them with a reference current.

In the illustrative embodiment, the values of the drain currents $I_{d1}$ and $I_{d2}$ can be increased or decreased on the basis of the capacitance $C_{CF2}$, $C_{FD}$ and $C_{FG2}$, as desired. This allows the difference ($I_{d1}$−$I_{d2}$) to be increased to a desired value. Stated another way, the illustrative embodiment allows the current window represented by the above difference to be broadened, as desired. A wide current window increases the margins of the drain currents $I_{d1}$ and $I_{d2}$ and reference current, thereby reducing the probability of incorrect identification of written data.

To sense the state (0, 1) from the cell transistor TC, electrons are injected into the left floating gate FG1 opposite to the right floating gate FG2. Therefore, the drain currents $I_{d1}$ and $I_{d2}$ are estimated in the same manner as in the above description, so that there holds ($I_{d1}$, $I_{d2}$)=(small, large)

As for the state (1, 1) to be sensed from the cell transistor TC, electrons are not injected into either one of the floating gates FG1 and FG2. In this case, the drain currents $I_{d1}$ and $I_{d2}$ both are great because the potential of the floating gate FG1 or that of the floating gate FG2 is not lowered by electrons. This condition is symmetrical in the right-and-left direction, i.e. the drain currents $I_{d1}$ and $I_{d2}$ are not different from each other; ($I_{d1}$, $I_{d2}$)=(great, large) holds.

Further, as for the state (0, 0), symmetry is set up in the right-and-left direction because electrons are injected into both of the floating gates FG1 and FG2. Therefore, ($I_{d1}$, $I_{d2}$)=(small, small) holds, meaning that the drain currents $I_{d1}$ and $I_{d2}$ are not different from each other.

Figure 9:
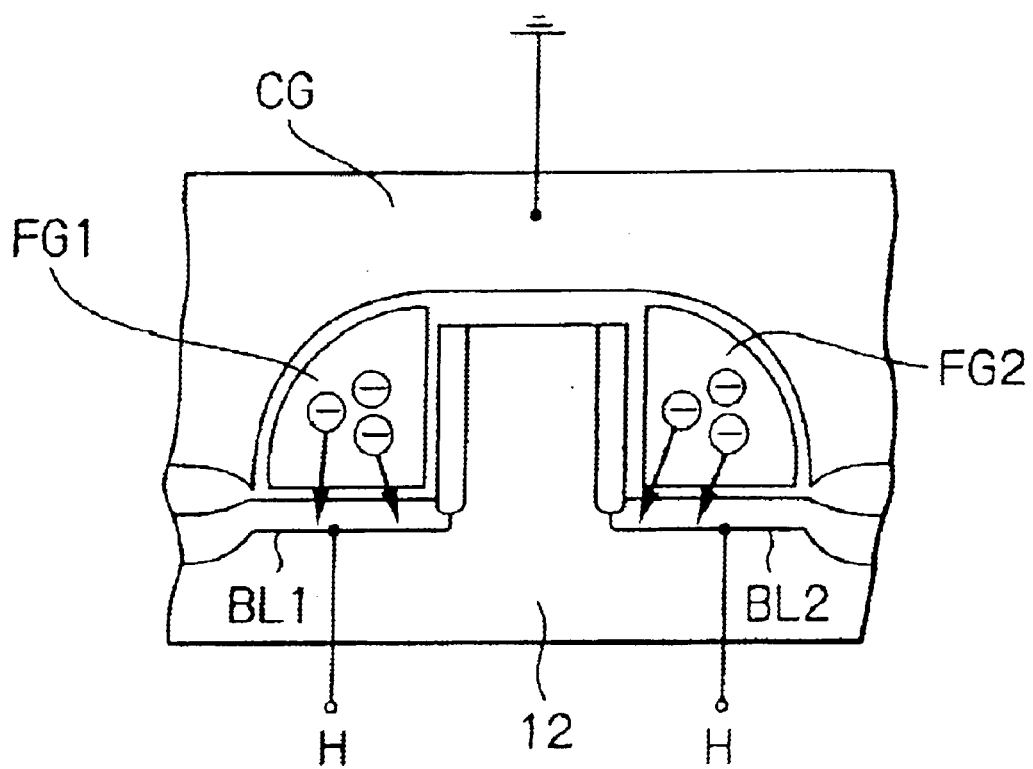
FIG. 9 shows a section useful for understanding a specific method of discharging electrons injected into floating gates that form part of the cell transistor.

Specific methods of discharging electrons, i.e. deleting the data stored, injected in the floating gates FG1 and FG2 available with the illustrative embodiment will be described hereinafter. FIG. 9 shows a specific method that withdraws electrons from the floating gates FG1 and FG2 into the source/drain regions BL1 and BL2, respectively. This method is practicable by connecting the control gate CG to ground and applying a high potential "H" (e.g. 12 V) to each of the source/drain regions BL1 and BL2. It is to be noted that the potential difference between the control gate CG and the source/drain region BL1 or BL2 can be set up relatively between the control gate CG and the source drain regions BL1 and BL2. For example, voltages of −6 V and 6 V may be applied to the control gate CG and source/drain regions BL1 and BL2, respectively.

Figure 10:
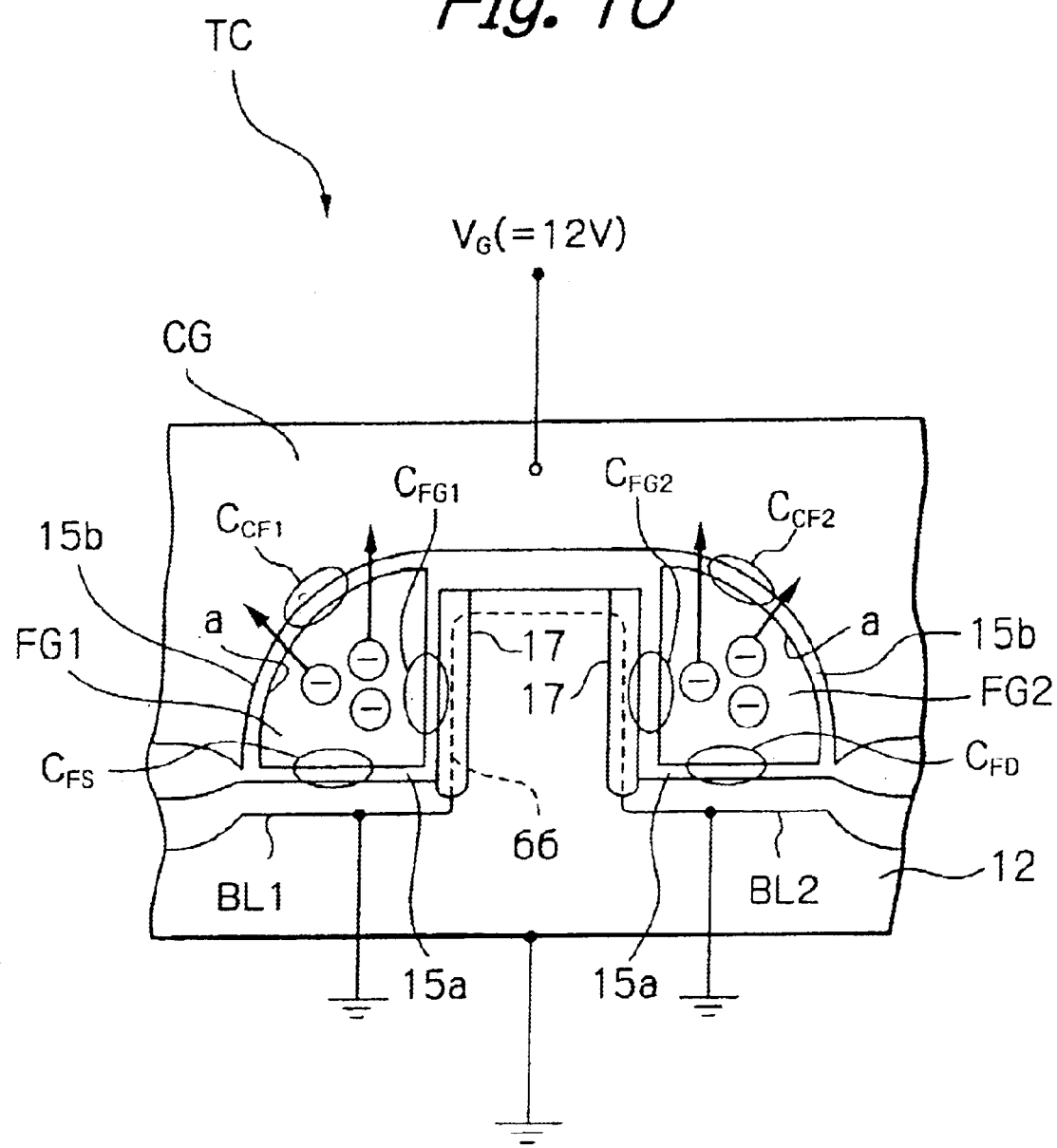
FIG. 10 shows a section useful for understanding another specific method of deleting electrons implanted in the floating gates.

FIG. 10 shows another specific method that applies a high potential VG (e.g. 12 V) to the control gate CG and connects the substrate 12 and source/drain regions BL1 and BL2 to ground. In this potential distribution, electrons are withdrawn from the floating gates FG1 and FG2 into the control gate CG via the inter-polycrystalline insulation layer 15*b* because the potential of the control gate CG is higher than the potentials of the gates FG1 and FG2. In this regard also, voltages of 6 V and −6 V may be applied to the control gate CG and source/drain regions BL1 or BL2, respectively, so as to set up the potential difference of 12 V between them.

Further, in the voltage distribution shown in FIG. 10, a layer of distributed electrons 66 is formed due to the potential of the control gate CG higher than that of the projection 13*a*. The electron layer 66 increases the capacitance CFG1 or CFG2 that, in turn, raises the potential of the floating gate FG1 or FG2 to the potential of the side wall 13*b* of the projection 13. Consequently, the potential of the floating gate FG1 or FG2 is pulled down by the potential of the side wall 13*b* and therefore further lowered. The resulting potential difference between the floating gate FG1 or FG2 and the side wall 13*b* is small enough to prevent the tunnel insulation layer 15*a* between them from being destroyed by a tunnel current.

Moreover, the potential difference between the floating gate FG1 or FG2 and the control gate CG increases relatively due to the potential of the floating gate FG1 or FG2 pulled toward the potential of the side wall 13*b*. As a result, a stronger electric field is established between the floating gate FG1 or FG2 and the control gate CG, and efficiently withdraws the stored electrons into the control gate CG.

The writing, reading and deleting operations of the illustrative embodiment have been shown and described on the assumption that the cell transistor 1 is selected in the memory cell array. In practice, however, the cell transistor 1 is sometimes not selected. Even when the cell transistor 1 is not selected, the drive voltage $V_{DD}$ is applied to the bit line BL1, see FIG. 3, in order to select other cell transistor TC. In this case, the potential of the floating gate FG1 of the unselected cell transistor TC is pulled toward the potential of the bit line BL1 due to a great capacitance $C_{FS}$ between the gate FG1 and the bit line BL1. As a result, the potential difference between the floating gate FG1 and the source/drain region BL1 decreases, so that the tunnel insulation layer 15*a* between the gate FG1 and the region BL1 is prevented from being exposed to the strong electric field. Consequently, a tunnel current that would deteriorate the tunnel insulation layer 15*a* is successfully prevented from flowing through the layer 15*a*.

Furthermore, the small potential difference stated above is successful to obviate hot holes that would otherwise appear at the PN junction of the source/drain region BL1 and the substrate 12 due to a strong electric field and would deteriorate the tunnel insulation layer 15*a*. In this manner, the illustrative embodiment improves resistance to inter-band tunneling.

It is noteworthy that the capacitance $C_{FS}$ ($C_{FD}$) between the floating gate FG1 (FG2) and the source/drain region BL1 (BL1) plays an important role in achieving the advantages described in relation to write-in, read-out and deletion as well as the unselected condition. In the illustrative embodiment, the floating gate FG1 (FG2) is positioned above the source/drain region BL1 (BL2) in order to reduce the distance between the floating gates FG1 and FG2, thereby reducing the device size and increasing the capacities $C_{FD}$ and $C_{FS}$.

Figure 25:
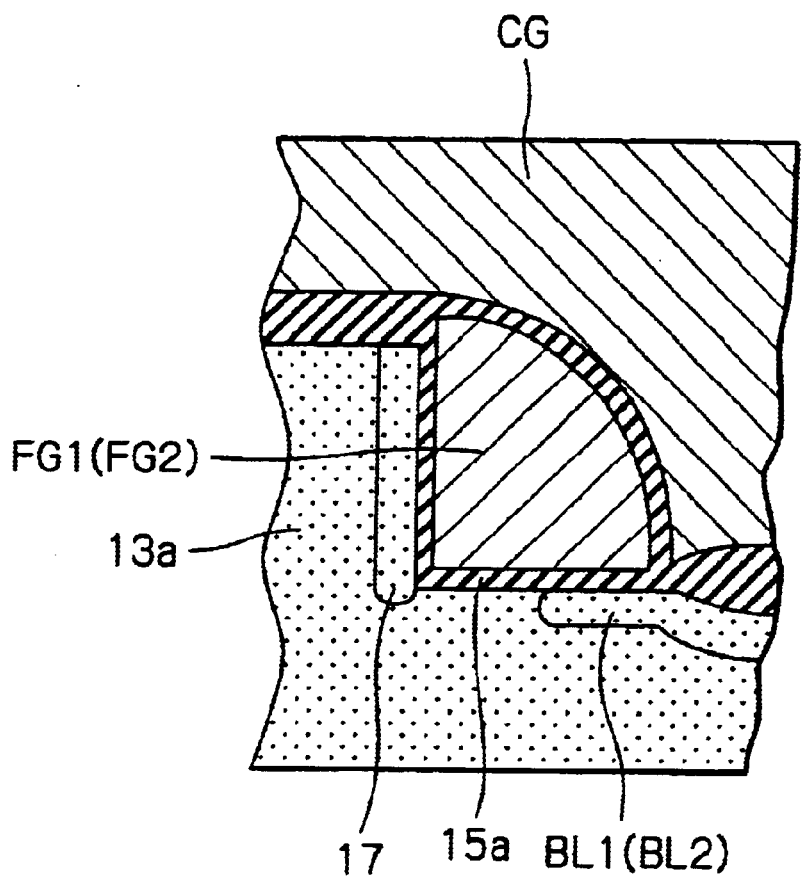
FIG. 25 is a cross-section view showing another specific configuration of a source/drain region available with the illustrative embodiment.
Figure 26:
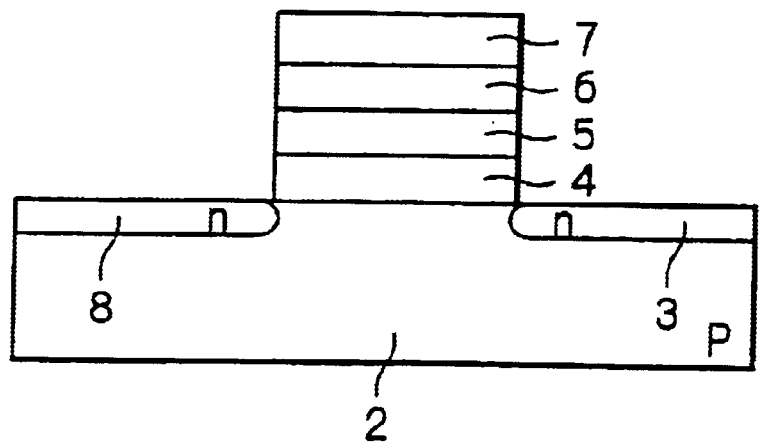
FIG. 26 shows a section of a prior art, multiple-bit cell transistor.
Figure 27A:
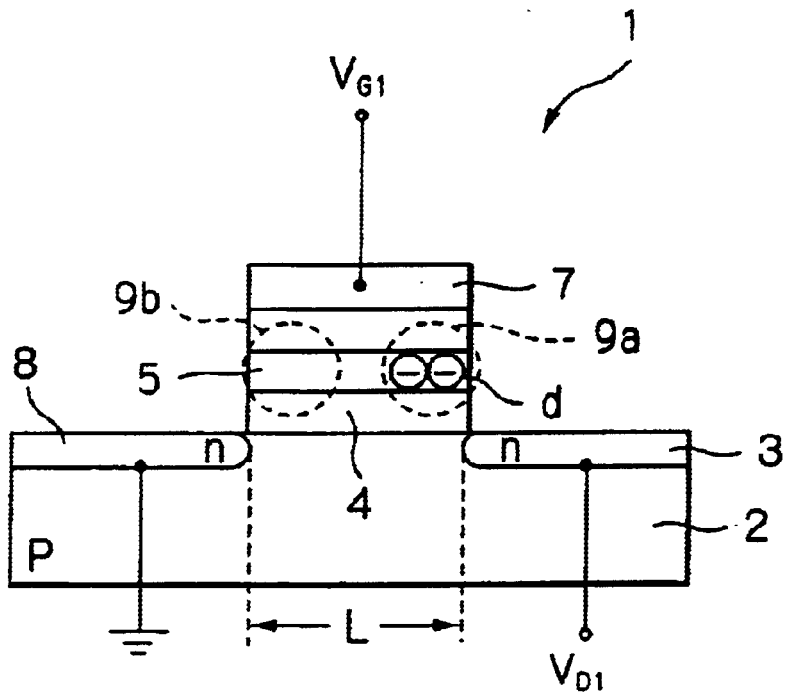
FIGS. 27A and 27B show sections useful for understanding a procedure for writing data in the prior art cell transistor.
Figure 27B:
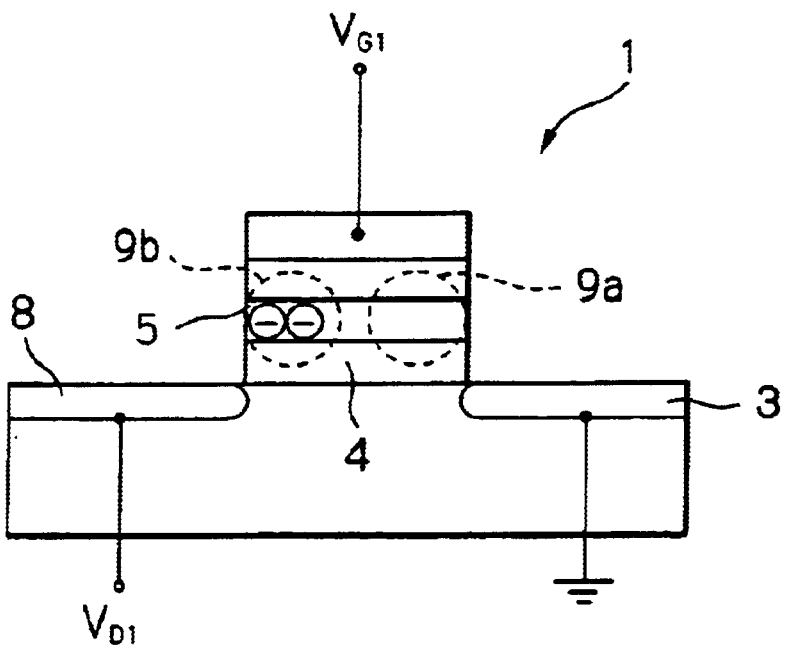
Figure 28A:
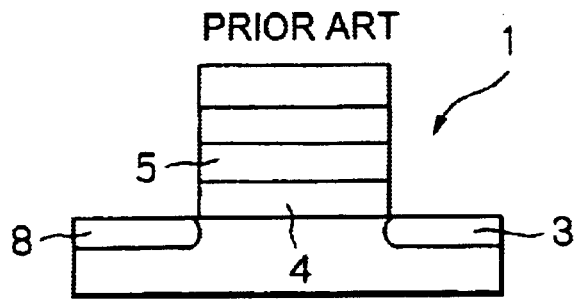
FIGS. 28A through 28D show sections representative of four different storage states particular to the prior art cell transistor.
Figure 28B:
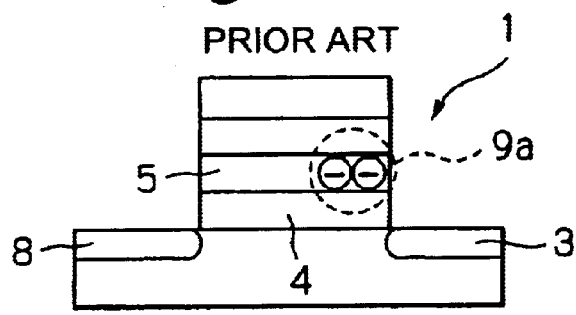
Figure 28C:
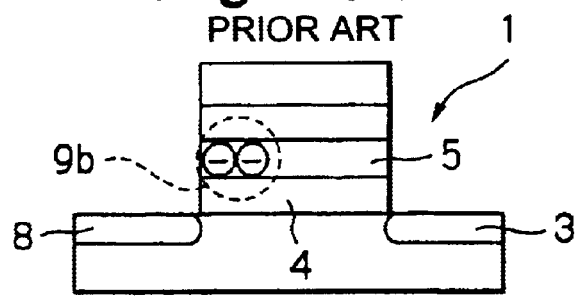
Figure 28D:
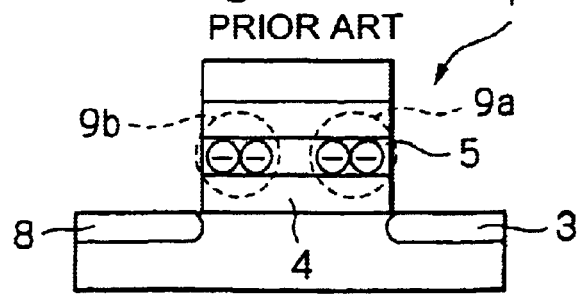
Figure 29:
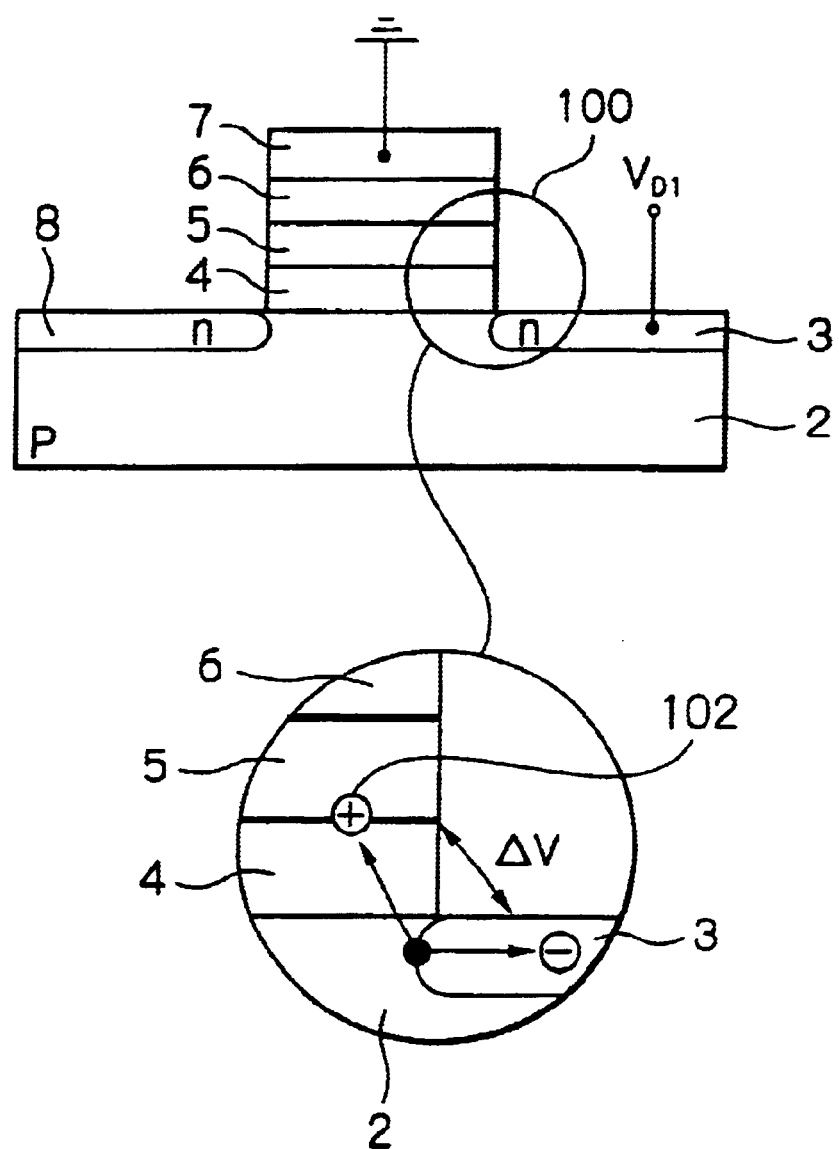
FIG. 29 shows a section useful for understanding why the prior art cell transistor is short of resistance to inter-band tunneling, together with an enlarged view of a portion thereof.
Figure 30A:
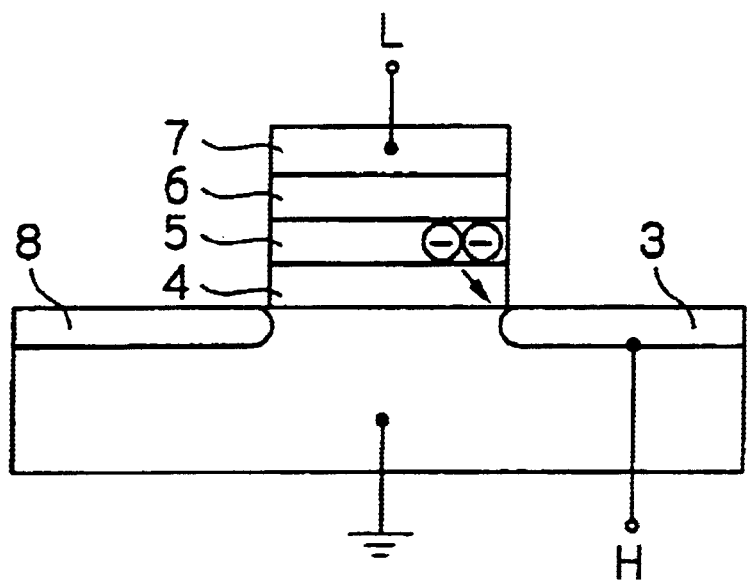
FIGS. 30A and 30B show sections useful for understanding the problem of a method of deleting stored data particular to the prior art cell transistor.
Figure 30B:
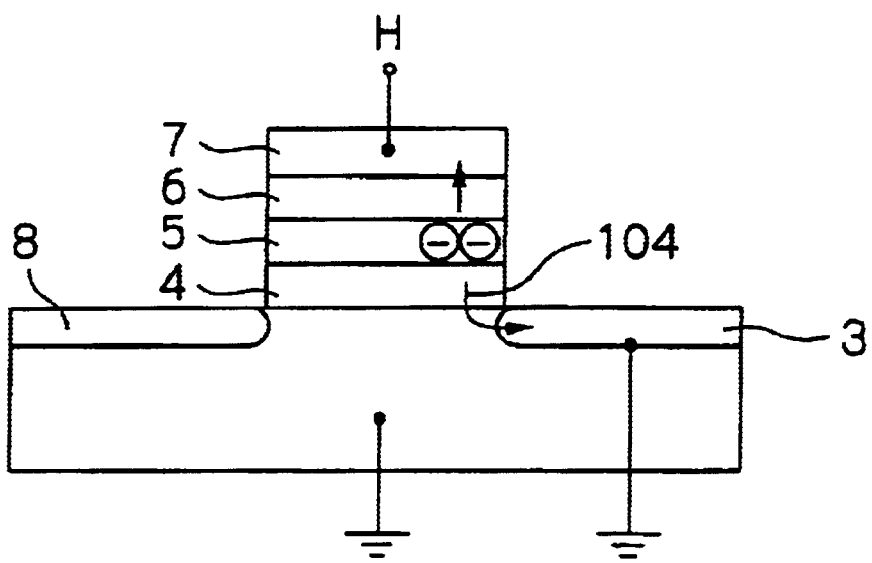

The area over which the floating gate FG1 (FG2) and source/drain region BL1 (BL2) face each other is open to choice. While the advantages described above are easier to achieve as the above area becomes larger, they are achievable even if the area is small. FIG. 25 shows another specific configuration in which the source/drain region BL1 (BL2) is set back from the projection 13*a*, causing part of the source/drain region BL1 (BL2) to face the floating gate FG1 (FG2). The advantages are achievable with such a configuration as well for the reason described above.

Figure 11:
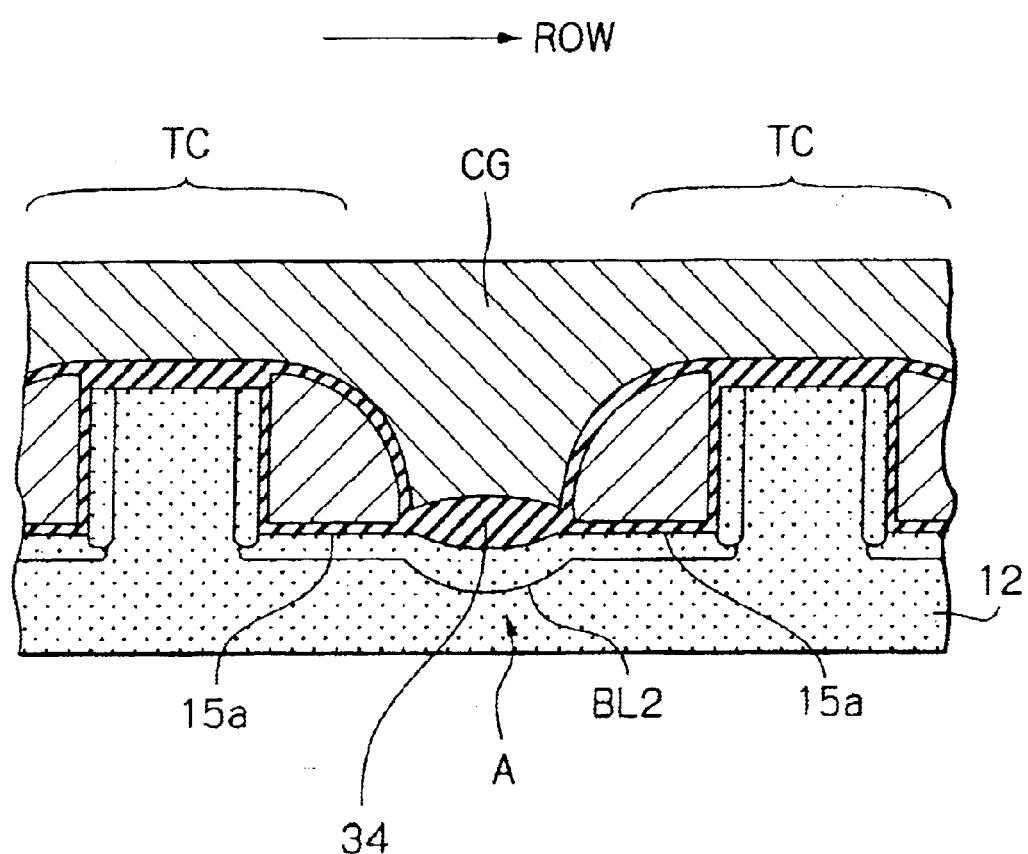
FIG. 11 is a cross-sectional view showing a selective oxide layer connecting tunnel insulation layers included in the cell transistor of the illustrative embodiment.

As shown in FIG. 11, in the illustrative embodiment, the control gate CG and bit line BL2 face each other at a portion A between the cell transistors TC adjoining each other in the direction of row. In this configuration, a leak current may flow between the control gate CG and the bit line BL2 in any one of the operation modes stated earlier. In light of this, it is preferable to form a selective oxide layer 34 contiguous with the tunnel insulation layers 15*a* and to make the selective oxide layer 34 thicker than the tunnel insulation layers 15*a*. The selective oxide layer 34 with such thickness obviates the above leak current.

The illustrative embodiment copes with punch-through and stabilizes the threshold voltage $V_{th}$ with the following implementations. When punch-through between the source/drain regions BL1 and BL2 is likely to occur, it is preferable to use a specific structure shown in FIG. 33. A graph shown in FIG. 33 together with the specific structure plots the concentration of boron, acting as a P type impurity, with respect to depth in the projection 13*a*. As shown, the boron concentration of the projection 13*a* sequentially increases in the direction of depth up to the root portion of the projection 13*a*. The boron concentration is therefore high on the portions of the side walls 13*b* adjoining the source/drain regions BL1 and BL2.

Figure 33:
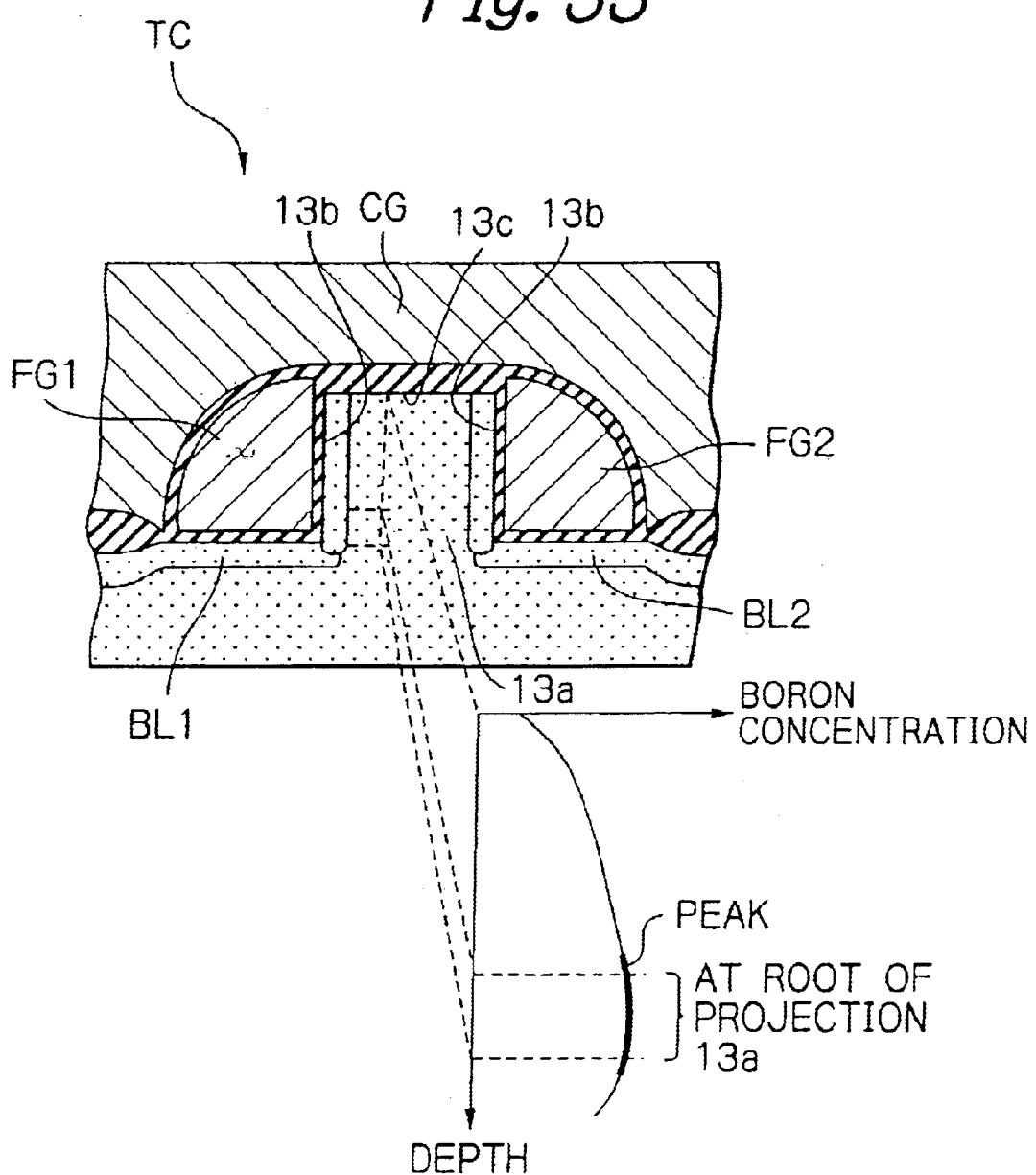
FIG. 33 shows a section useful for understanding a modified configuration applicable to the illustrative embodiments with the boron concentration distribution of a projection shown in connection therewith.

In the structure shown in FIG. 33, the concentration of the P type impurity is higher on the channel region adjoining the N type source/drain regions BL1 and BL2. The channel region is therefore formed in at a position spaced from a region linearly connecting the N type source/drain regions BL1 and BL2 and close to the regions BL1 and BL2, i.e. formed on the surfaces of the side walls 13*b* and top 13*c* of the projection 13. This means that the higher impurity concentration of the P type in the channel region adjoining the source/drain regions BL1 and BL2 serves to obstruct the punch-through of the source/drain regions BL1 and BL2 also. Such cell transistors can therefore be densely integrated to construct a semiconductor memory.

The threshold voltage $V_{th}$ of the cell transistor TC is noticeably susceptible to the impurity concentration on the portions of the side walls 13*b* close to the root portion of the projection 13*a*. It follows that the higher boron concentration at the root portion of the projection 13*a* results in a higher threshold voltage $V_{th}$. However, the N type impurity of the N type regions 17 formed on the side walls 13*b* and the P type impurity of the side walls 13*b* compensate each other, so that the substantial acceptor concentration of the side walls 13*b* can be lowered. Therefore, even if the boron concentration is increased in the root portion of the projection 13*a*, the N type regions 17 surely prevent the threshold voltage $V_{th}$ from rising to an excessive degree.

Because the threshold voltage $V_{th}$ is susceptible to the impurity concentration of the root portion of the projection 13*a*, as stated above, the impurity concentration of the root portion should preferably be prevented from noticeably varying in order to stabilize the threshold voltage $V_{th}$. For this purpose, it is preferable not only to increase the boron concentration of the projection 13*a* little by little, but also to make a peak thereof as flat as possible, as indicated by bold part of the curve shown in FIG. 33. In such a flat portion, the boron concentration varies little, so that a relation between the boron concentration and the arsenic concentration of the N type regions 17 remains substantially constant. This is successful to maintain the threshold voltage $V_{th}$ stable.

Figure 12:
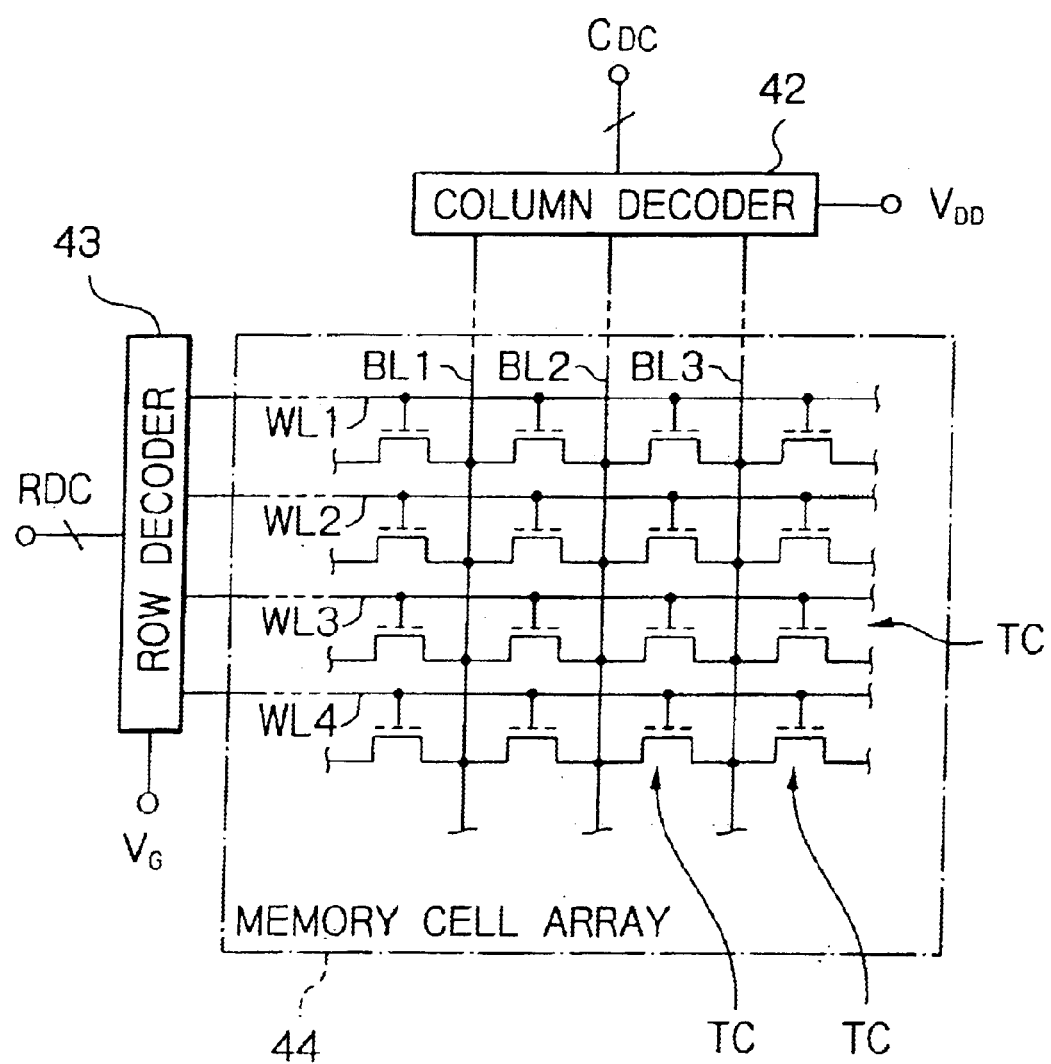
FIG. 12 is a block diagram schematically showing the general configuration of the semiconductor memory of the illustrative embodiment.

Reference will be made to FIG. 12 for describing the general circuit arrangement of the illustrative embodiment. As shown, a memory cell array 44 includes cell transistors TC arranged in rows and columns. Control gates WL1 through WL4, which function as word lines in the circuitry, each being shared by a particular row of cell transistors TC are connected to the output of a row decoder 43. The row decoder 43 decodes a low decode signal RDC having a preselected number of bits to thereby select one of the word lines WL1 through WL4 corresponding to the signal RDC. A gate voltage $V_G$ is applied to one of the word lines WL1 through WL4 selected. The gate voltage VG is switched in accordance with the operation mode; a write mode, a read mode or a delete mode. More specifically, the gate voltage $V_G$ is 2.2 V in the write and read modes or 12 V in the delete mode, as stated earlier. The word lines WL1 through WL4 may, when not selected, be brought into the floating state thereof.

The bit lines BL1 through BL3 associated with the cell transistors TC are connected to the output of a column decoder 42. The column decoder 42 decodes a column decode signal CDC having a preselected number of bits to thereby select one of the bit lines BL1 through BL3 corresponding to the signal CDC. A voltage $V_{DD}$ is fed to one of the bit lines BL1 through BL3 selected. The voltage $V_{DD}$ is switched in accordance with the operation mode; the write mode, the read mode or the delete mode. More specifically, the voltage $V_{DD}$ is the ground or reference voltage or 6 V in the write mode, the ground voltage or 1.6 V in the read mode or the ground voltage in the delete mode, as stated earlier. The bit lines BL1 through BL3 each may, when not selected, be brought into a floating state thereof.

The cell transistors TC each are selected by a bit line BLi selected and a word line WLj selected in any one of the write mode, read mode, and delete mode, where i and j are natural numbers.

Figure 13A:
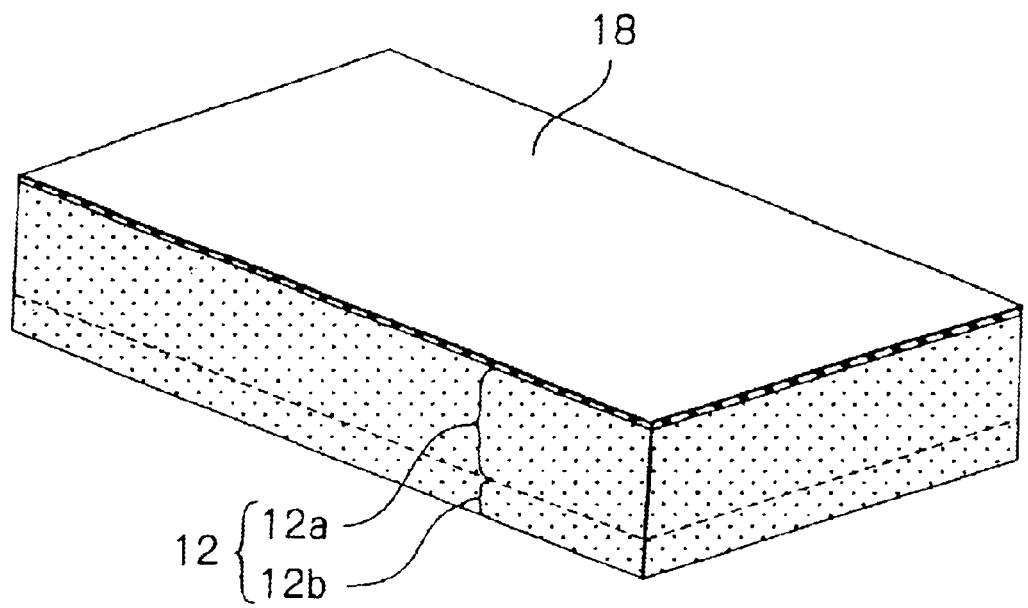
FIGS. 13A through 24 are fragmentary perspective views demonstrating a series of steps for manufacturing the semiconductor memory of the illustrative embodiment.
Figure 13B:
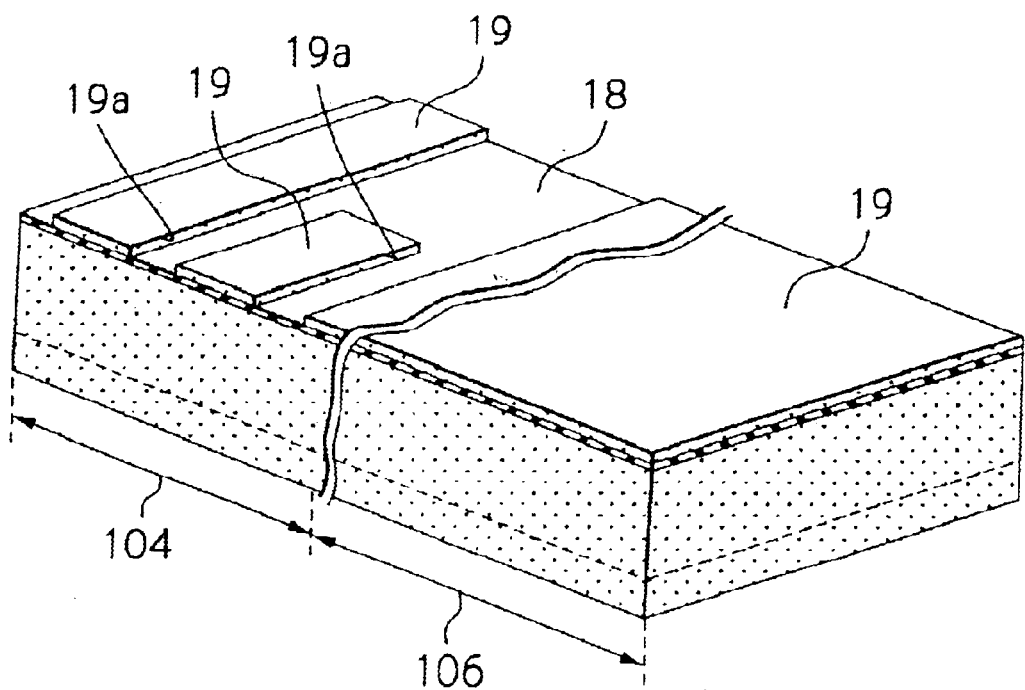

Specific processes of manufacturing the semiconductor memory of the illustrative embodiment will be described with reference to FIGS. 13A through 24. First, as shown in FIG. 13A, the planar substrate 12 of P type silicon or one-conductivity type semiconductor substrate is prepared. The semiconductor substrate 12 is made up of the P+ type substrate 12b having boron concentration of $4.0 \times 10^{18}$ cm$^{-2}$ and P type epitaxial layer 12a formed on the substrate 12b and having boron concentration of $1.0 \times 10^{15}$ cm$^{-2}$. A silicon thermal oxide layer 18 is formed on one of the primary surfaces of the semiconductor substrate 12 beforehand. Subsequently, as shown in FIG. 13B, the silicon nitride layer 19 is formed on the silicon thermal oxide layer 18 and then patterned to form an aperture 19a.

In the illustrative embodiment, the production of the cell transistors can be executed in parallel with the production of a CMOS transistors. A procedure for producing CMOS transistors will be described hereinafter together with the procedure for producing the cell transistors. In the figures, a CMOS transistor portion 104 refers to a portion allocated to a CMOS transistor to be formed later while a cell transistor portion 106 refers to a portion allocated to the cell transistor. The aperture 19a is included a preselected portion of the CMOS transistor portion.

Figure 14A:
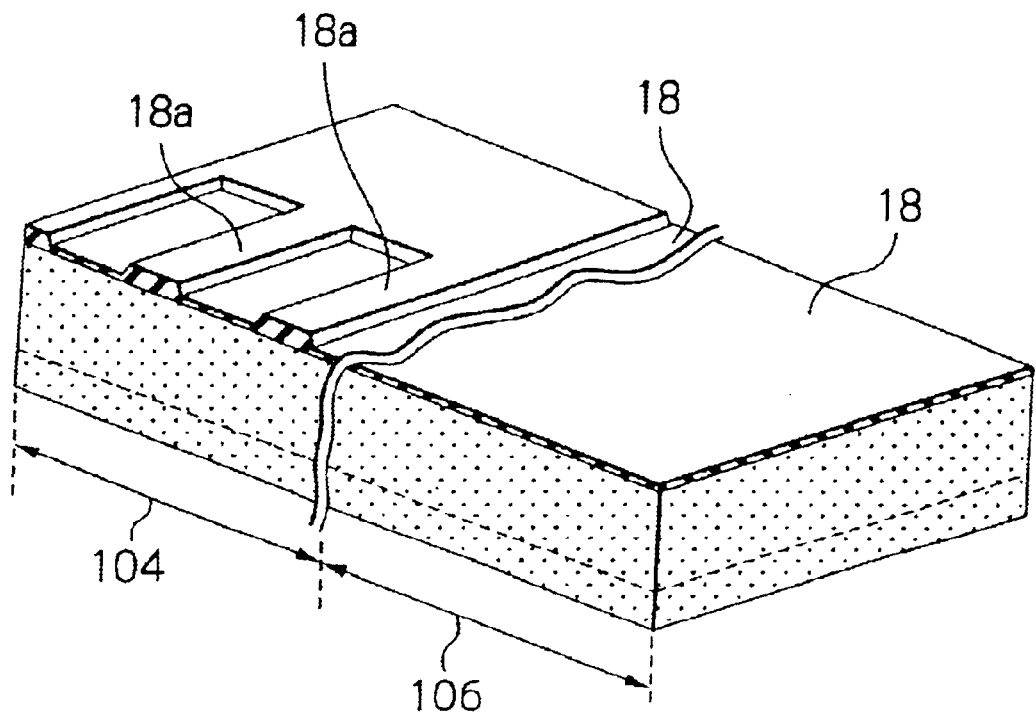

Subsequently, as shown in FIG. 14A, a field oxide layer 18 is formed. More specifically, the field oxide layer 18a is caused to grow with the silicon nitride layer 19, FIG. 13B, serving as a mask. After the growth of the field oxide layer 18a, the silicon nitride layer 19 is removed by etching.

Figure 14B:
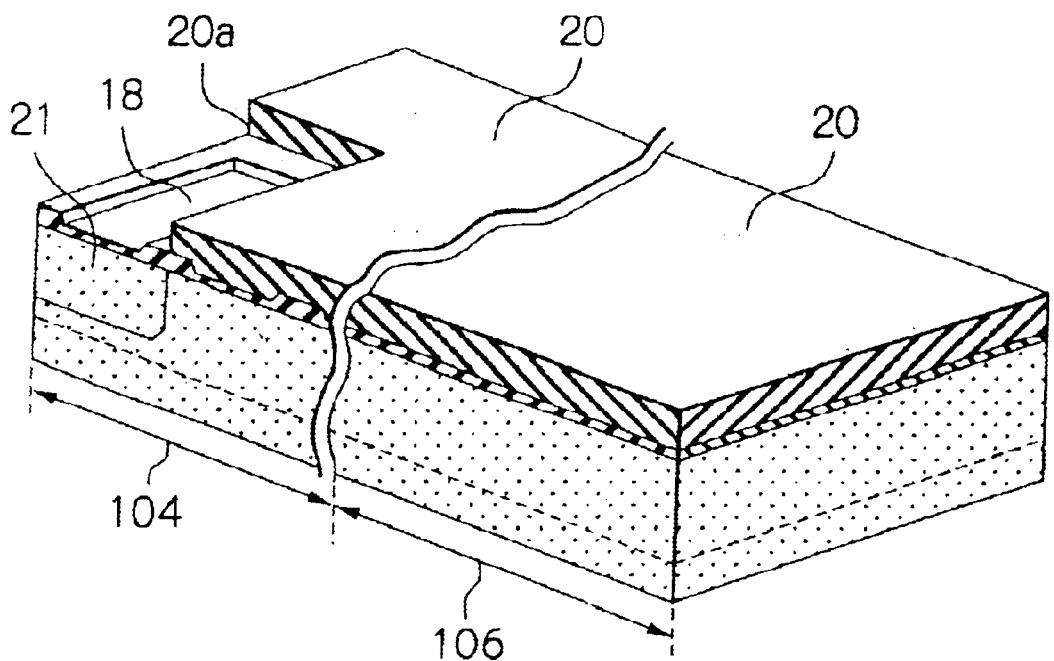

After the step of FIG. 14A, as shown in FIG. 14B, a photoresist layer 20 is coated on the entire surface of the laminate and then exposed and developed to form an aperture 20a. Subsequently, arsenic ions are implanted over the photoresist layer or mask 20 to thereby form an N type well 21 beneath the aperture 20a. Thereafter, the photoresist layer 20 is removed.

Figure 15A:
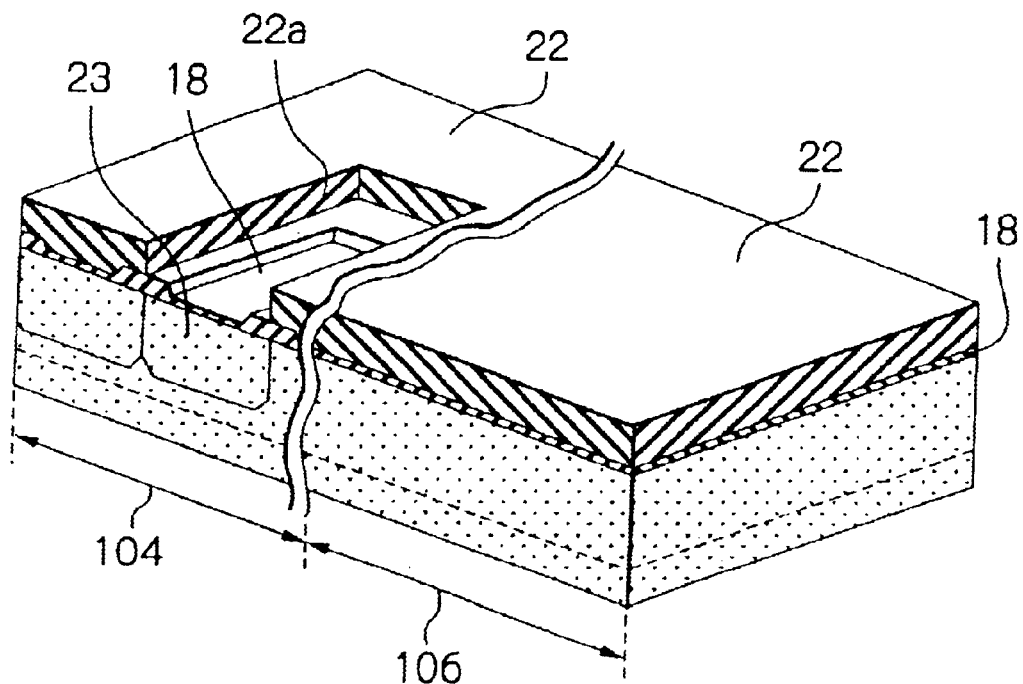

As shown in FIG. 15A, after the formation of the N well 21, a photoresist layer 22 is newly coated on the entire surface of the laminate and then exposed and developed to form an aperture 22a. Subsequently, boron ions are implanted over the photoresist layer or mask 22 to thereby form a P type well 23 beneath the aperture 22a. Thereafter, the photoresist layer 22 is removed.

Figure 15B:
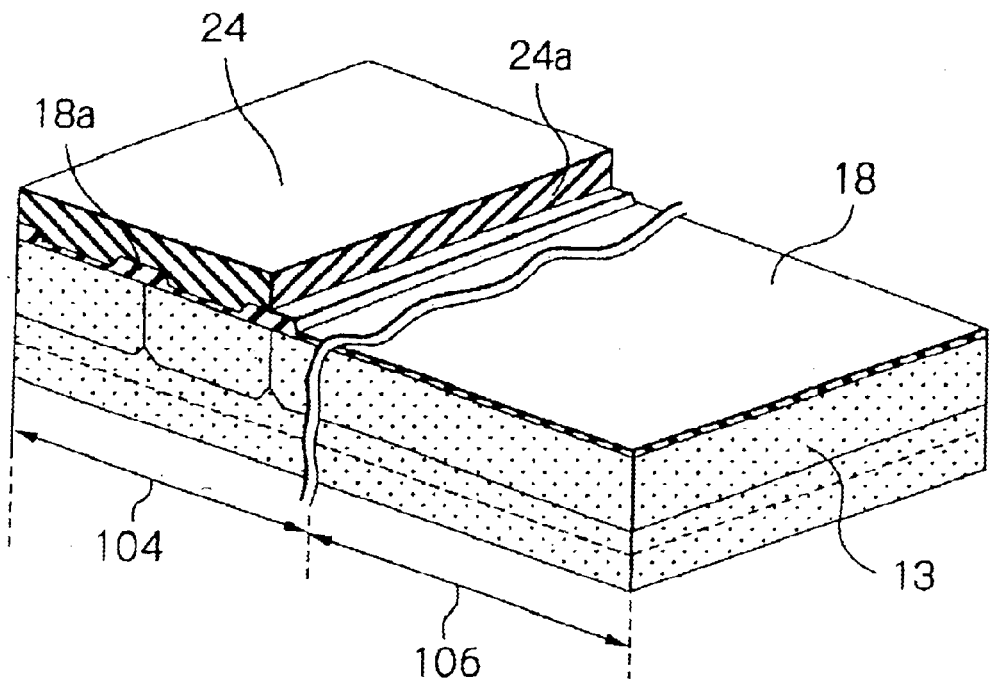

After the step of FIG. 15B, a photoresist layer 24 is coated on the entire surface of the laminate and then exposed and developed to form an aperture 24a, which is positioned at the top of the cell transistor portion. Ions are implanted over the photoresist layer or mask 24 to thereby form the P type well 13. More specifically, ions are implanted four consecutive times under the following conditions. An ion seed is BF2 for the first and second ion implantation and is B (boron) for the third and fourth ion implantation. Acceleration energy is 15 keV for the first ion implantation, 45 keV for the second ion implantation, 20 keV for the third ion implantation, and 40 keV for the fourth ion implantation. Further, a dose is $5.0 \times 10^{11}$ cm$^{-2}$ for the first ion implantation, $5.0 \times 10^{11}$ cm$^{-2}$ for the second ion implantation, $6.0 \times 10^{12}$ cm$^{-2}$ for the third ion implantation, and $5.0 \times 10^{12}$ cm$^{-2}$ for the fourth ion implantation.

Figure 34:
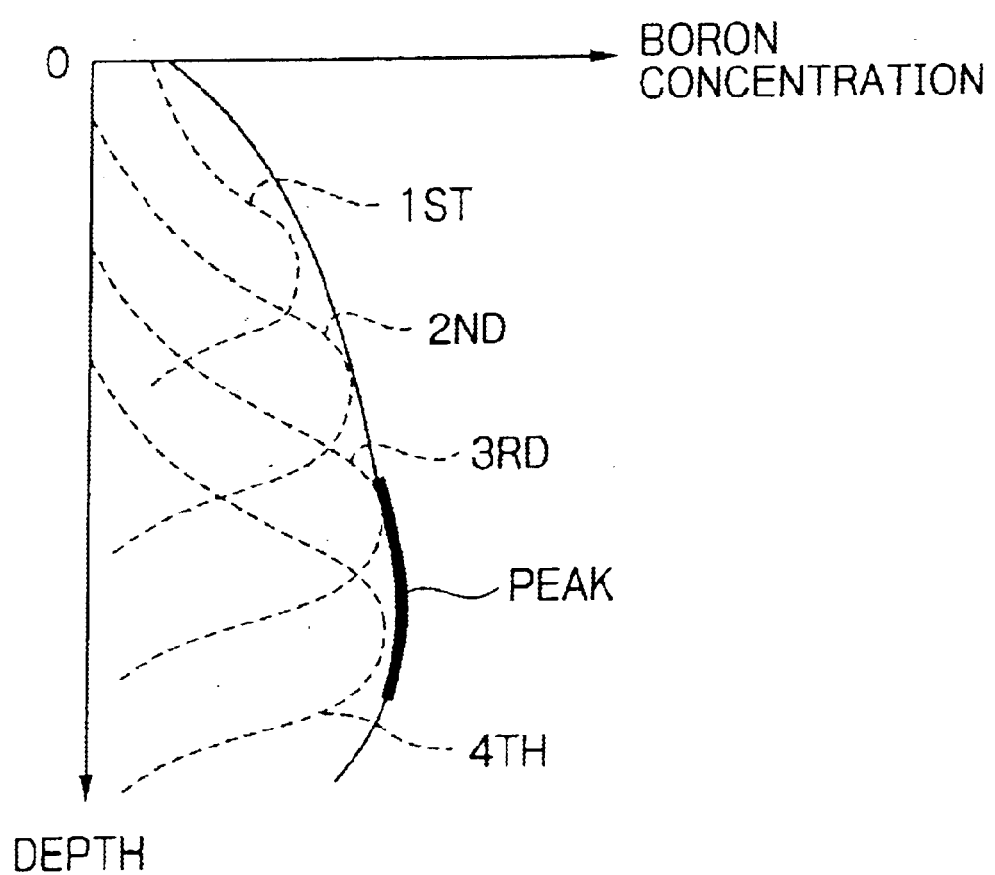
FIG. 34 is a graph plotting a relation between the depth of a P type well included in the illustrative embodiments, as measured from a surface, and boron concentration.

The P type well 13 subjected to the four times of ion implantation has a boron concentration distribution shown in FIG. 34. Specifically, FIG. 34 shows a relation between the depth of the P well 13, as measured from the surface, and boron concentration. In FIG. 34, net boron concentration is represented by an envelope (solid curve) enveloping the boron concentrations of the consecutive times of ion implantation. As shown, the boron concentration distribution has a peak indicated by the bold portion of the curve. It is preferable to make the peak flat by suitably adjusting the implantation conditions and to cause the flat portion to extend in the direction of depth as far as possible, as will be understood from FIG. 16B to be described later.

Figure 16A:
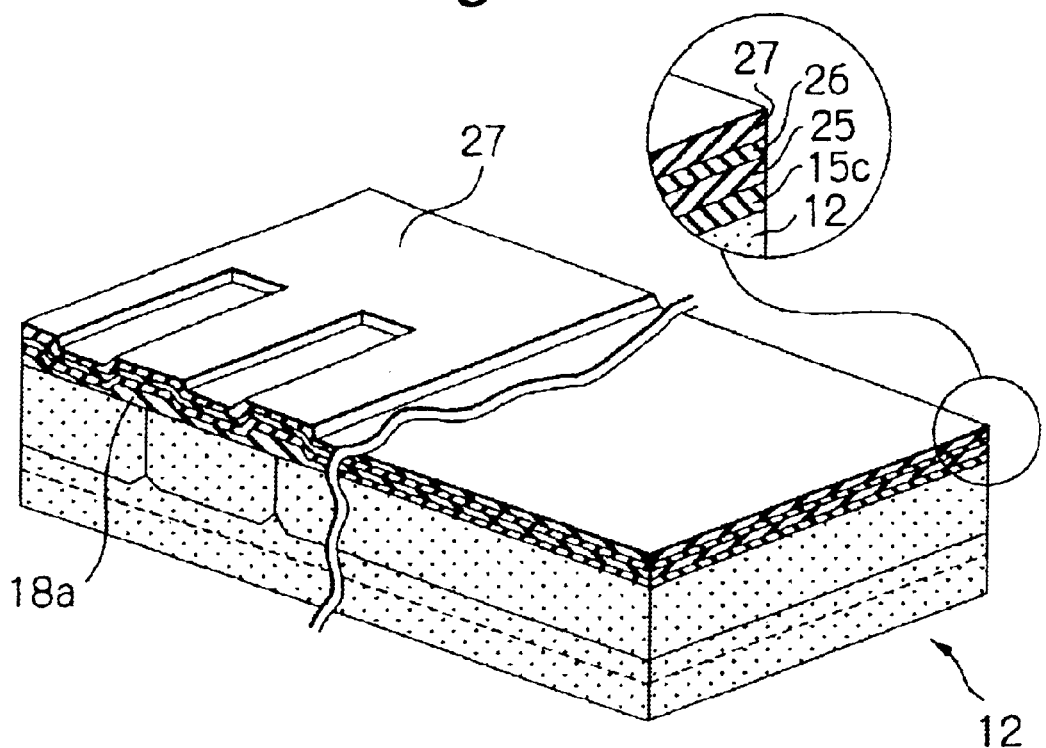

FIG. 16A shows a step to be executed after the step of FIG. 15B. As shown, the silicon thermal oxide layer 18 is etched out with the field oxide layer 18a being left on the laminate. Subsequently, the surface of the substrate 12 is again subjected to thermal oxidation for thereby forming the gate insulation layer 15c, which is about 10 nm thick. The silicon nitride layer 25 that is about 10 nm thick, silicon oxide layer 26 that is about 4 nm thick and silicon nitride layer 27 that is about 50 nm are sequentially formed on the gate insulation layer 15c. The functions of such layers, which are formed by a conventional CVD (Chemical Vapor Deposition) method, will be understood from the description of steps to follow.

Figure 16B:
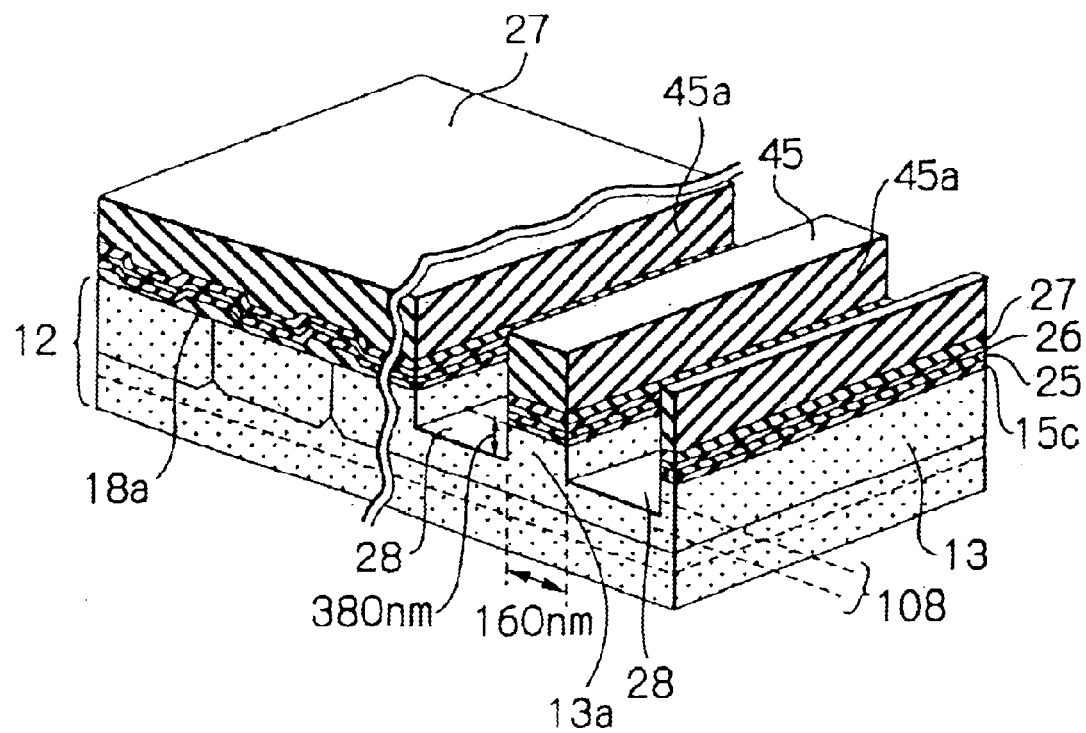

As shown in FIG. 16B, a photoresist layer 45 is coated on the silicon nitride layer 27 positioned on the top of the above laminate. The photoresist layer 45 is then exposed and developed to form stripe-like apertures 45a. Subsequently, etching is effected over the photoresist layer or mask 45 to thereby open the silicon nitride layers 25 and 27, silicon oxide layer 26, and gate insulation layer 15c. Thereafter, the P type silicon substrate 12 is etched via the openings of the above layers so as to form trenches 28 such that the bottoms of the trenches 28 coincide with the peak of the boron concentration, see FIG. 34. The peak of the boron concentration is made flat and extends as deep as possible in the step of FIG. 15B, as stated earlier. Therefore, the bottom of each trench 28 can surely coincide with the peak of the boron concentration even if the depth of the trench 28 is inaccurate for process reasons.

By the procedure described so far, there are formed the projections 13a each having high boron concentration at its root portion, as described with reference to FIG. 33. Although impurity concentration at the root portion has great influence on the threshold voltage $V_{th}$, the threshold voltage $V_{th}$ is prevented from varying because the bottom of each trench 28 surely coincides with the peak of the boron concentration.

While the size of each trench 28 is open to choice, the trench 28 is about 380 nm in the illustrative embodiment. Also, the distance between nearby trenches 28, i.e. the width of the projection 13a is about 160 nm. After the formation of the trenches 28, the photoresist layer 45 is removed.

Figure 17A:
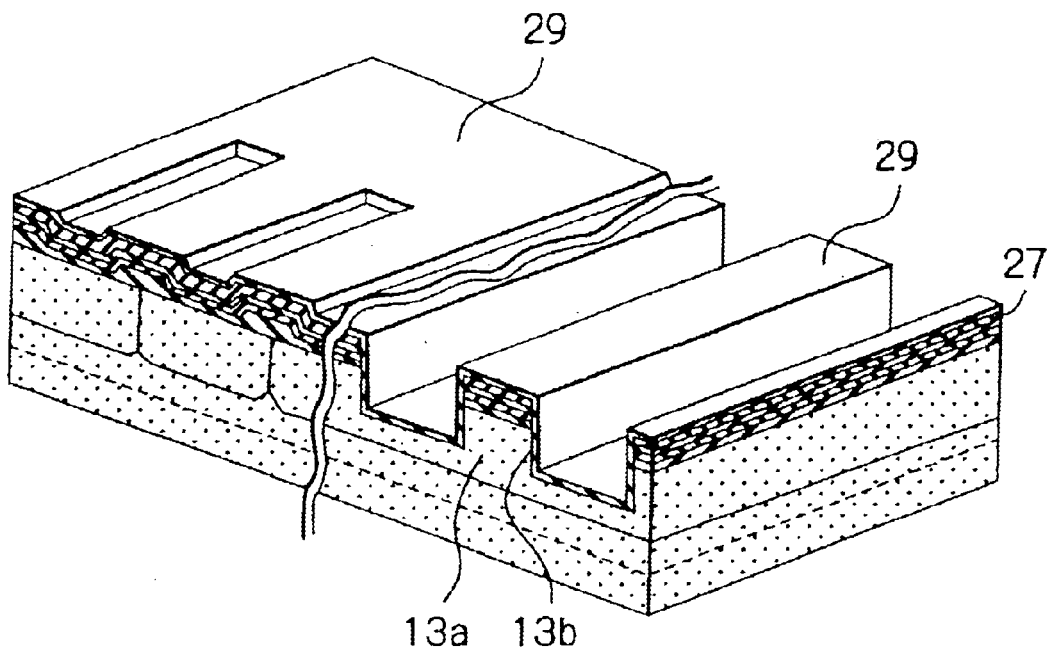
Figure 17B:
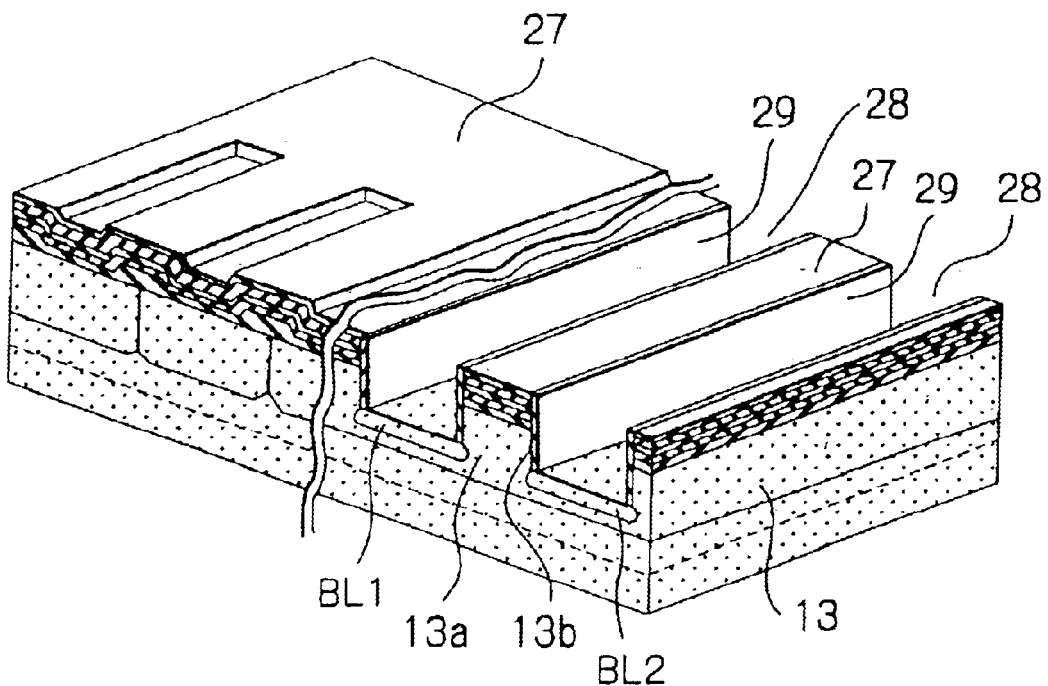

As shown in FIG. 17A, after the step of FIG. 16B, the silicon oxide layer 29 that is about 20 nm is formed on the entire exposed surface of the laminate by the CVD method. Subsequently, as shown in FIG. 17B, the silicon oxide layer 29 is subjected to anisotropic etching in the direction of thickness by RIE (Reactive Ion Etching). As a result, the silicon oxide layer 29 is removed except for part thereof present on the side walls 13b of the projection 13a.

After the removal of the silicon oxide layer 29, arsenic ions (As) are implanted to form the bit lines BL1 and BL2 in the bottoms of the trenches 28. At this instant, the silicon oxide layer 29 left on the side walls 13b prevent arsenic ions from being implanted in the side walls 13b. Further, the projection 13a, which serves as a mask, allows the bit lines BL1 and BL2 to be formed in the bottoms of the trenches 28 by a self-alignment process. The arsenic ions are implanted with acceleration energy of 15 keV in a dose of $2.0 \times 10^{14}$ cm$^{-2}$.

After the implantation of arsenic ions, the silicon oxide layer 29 present on the side walls 13a are etched by about 10 nm to be thinned thereby. Because the etched silicon oxide layer 29 is extremely thin, it is not shown in the figures to follow.

Figure 18A:
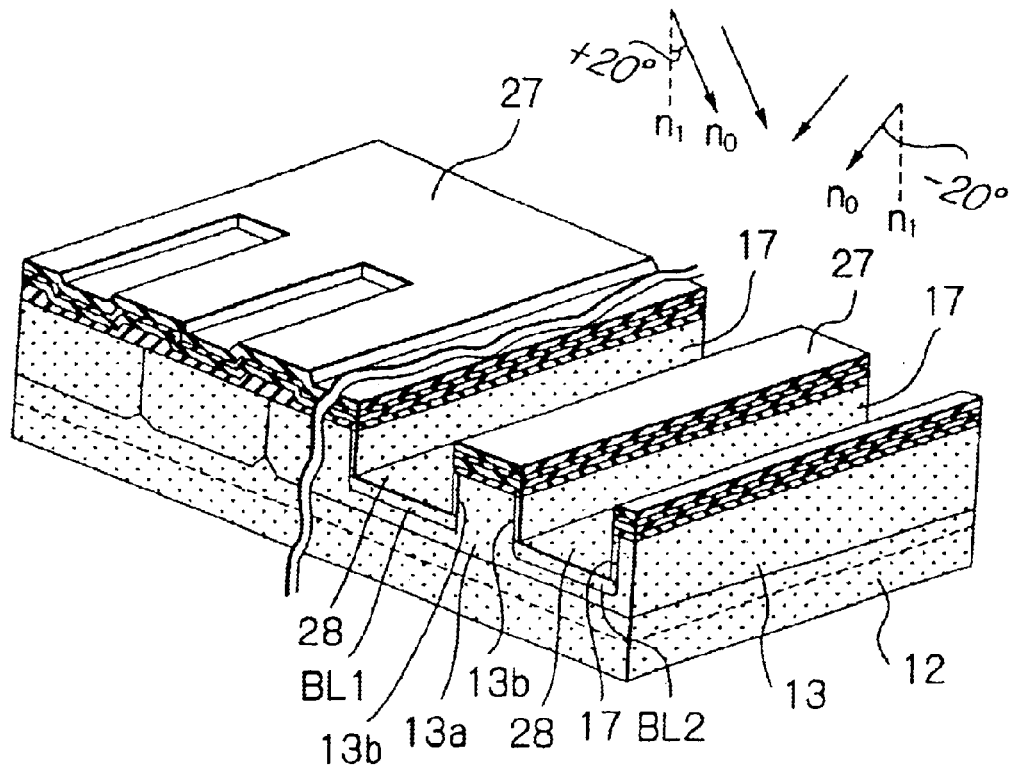

FIG. 18A shows a step to be executed after the step of FIG. 17B. As shown, arsenic ions are implanted in the side walls 13b of the projection 13a to thereby form the N type regions 17 of counter-conductivity type on the side walls 13b. This implantation can be done if the substrate 12 is tilted relative to the direction of implantation. In the illustrative embodiment, a line n1 normal to the P type silicon substrate 12 is inclined by about +/−20° relative to the direction of implantation. At this time, arsenic ions are implanted with acceleration energy of 10 keV in a dose of $5.0 \times 10^{11}$ cm$^{-2}$. It is noteworthy that the thin silicon oxide layer 29 present on the side walls 13b, see FIG. 17B, prevents the arsenic ions from being excessively implanted in the side walls 13b.

The surface layers of the trenches 28 are expected to implement the channel of the device, so that the property of the surface layers has critical influence on the device characteristics. It is therefore necessary to protect the surfaces of the trenches 28 from contamination in the steps to follow. For this purpose, in the illustrative embodiment, an about 4 nm thick, sacrifice silicon oxide layer 31 is formed on the sides and bottoms of the trenches 28 by thermal oxidation. The sacrifice silicon oxide layer 31 successfully protects the surfaces of the trenches 28 from contamination. Moreover, this layer 31 serves to remove a lattice defect particular to the surface layers of the trenches 28, thereby preventing the device characteristics from being degraded. Subsequently, an about 60 nm thick, silicon oxide layer or mask 30 is formed on the entire exposed surface of the laminate inclusive of the inside of the trenches 28 by CVD method.

Figure 18B:
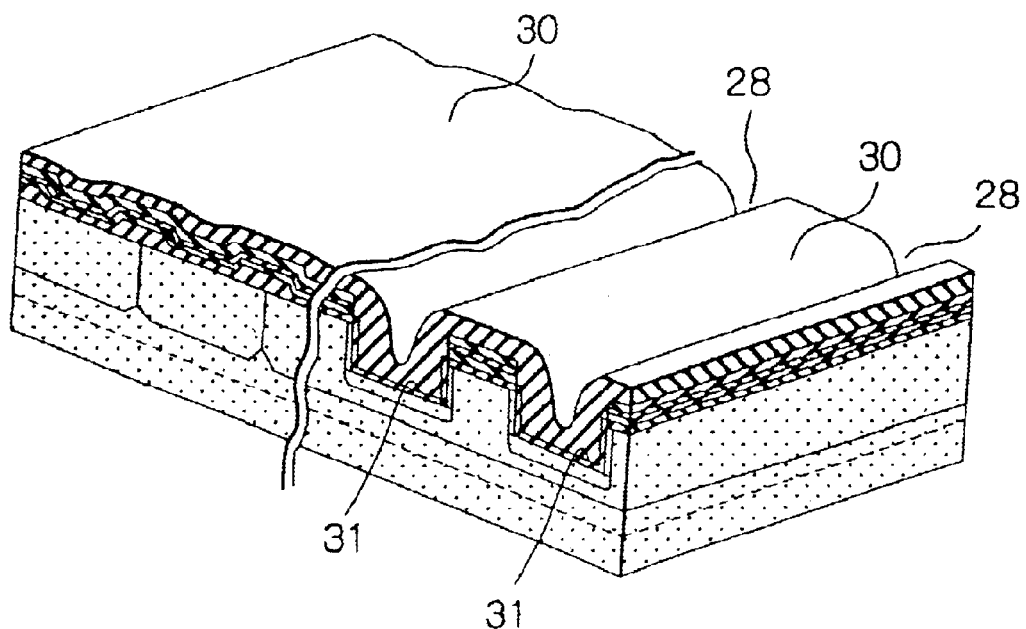
Figure 19A:
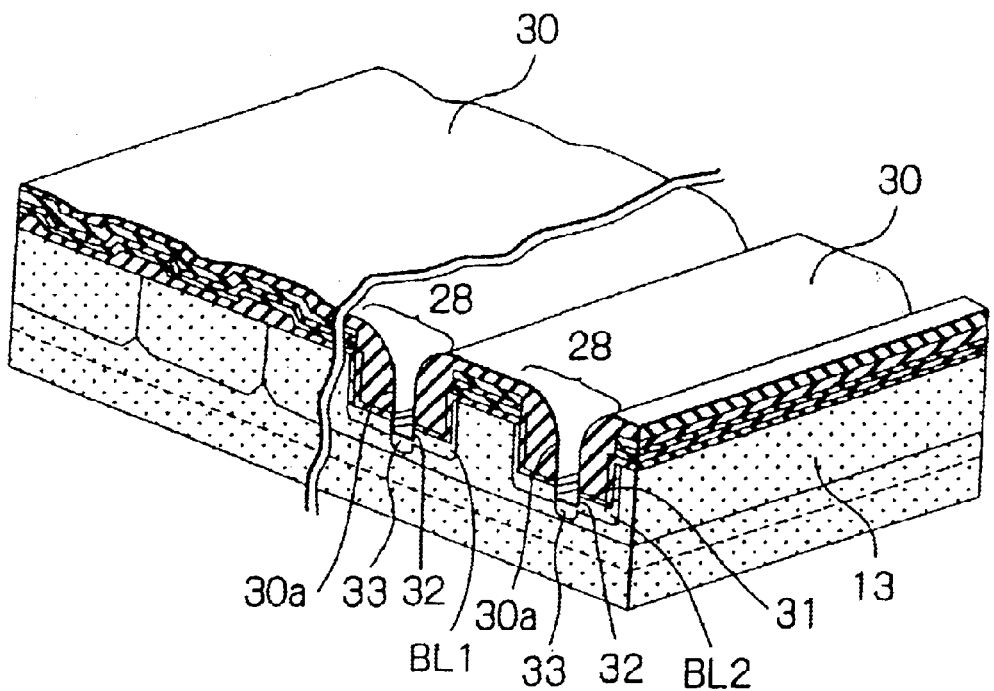

As shown in FIG. 19A, after the step of FIG. 18B, the silicon nitride layer 30 is subjected to anisotropic etching in the direction of thickness in order to form elongate grooves 30a. Subsequently, the sacrifice silicon oxide layer 31 and part of the bit lines BL1 and BL2 are selectively etched with the silicon nitride layer 30 serving as a mask. As a result, recesses 32 are formed in the bit lines BL1 and BL2 to a depth of about 10 nm each.

After the recesses 32 have been formed, arsenic ions are implanted in the bit lines BL1 and BL2 via the grooves 30a in order to lower the resistance of the bit lines BL1 and BL2. At this time, the arsenic ions are implanted with acceleration energy of 30 keV in a dose of $3.0 \times 10^{15}$ cm$^{-2}$. In FIG. 19A, the portions, i.e. n$^+$ areas where the arsenic ions are implanted are designated by the reference numeral 33.

Figure 19B:
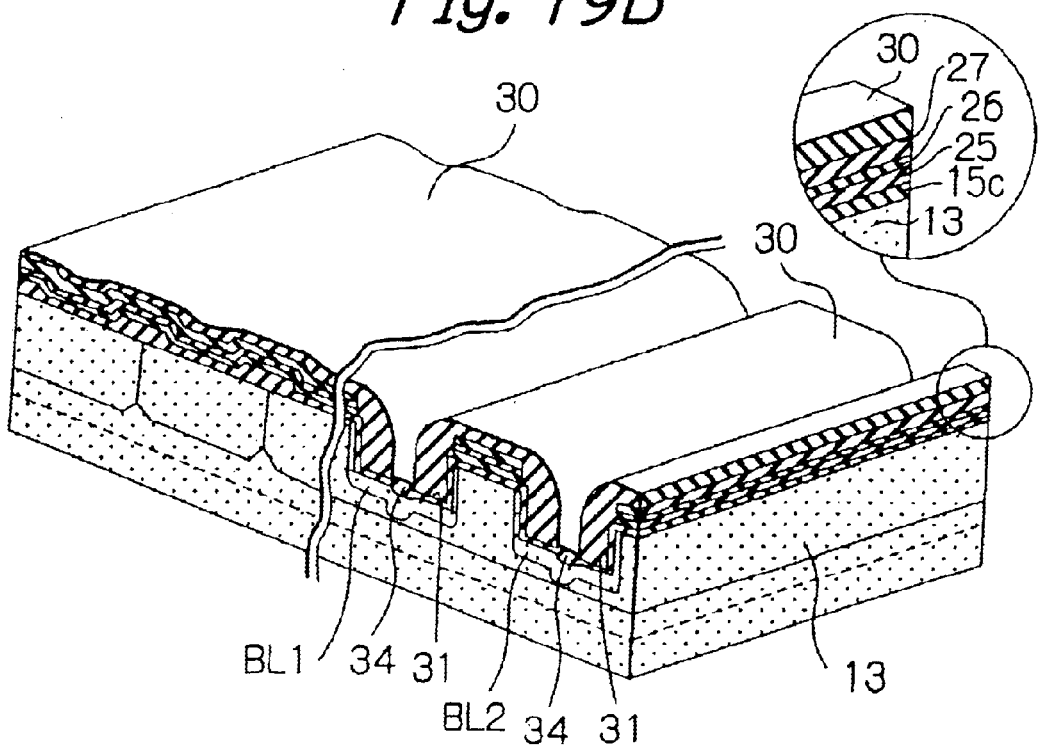

Subsequently, as shown in FIG. 19B, the recesses 32 are selectively oxidized with the silicon nitride layer 30 serving as a mask, thereby forming the selective oxide layers 34. After this step, the silicon nitride layers 27 and 30 are removed by etching. At this instant, the silicon oxide layer 26 and sacrifice silicon oxide layer 31 play the role of an etching stopper. Subsequently, the silicon oxide layer 26 is removed by etching with the silicon nitride layer 25 serving as an etching stopper. This etching is effected to such a degree that the silicon oxide layer 26 is fully removed, but the selective oxide layers 34 remain.

Figure 20A:
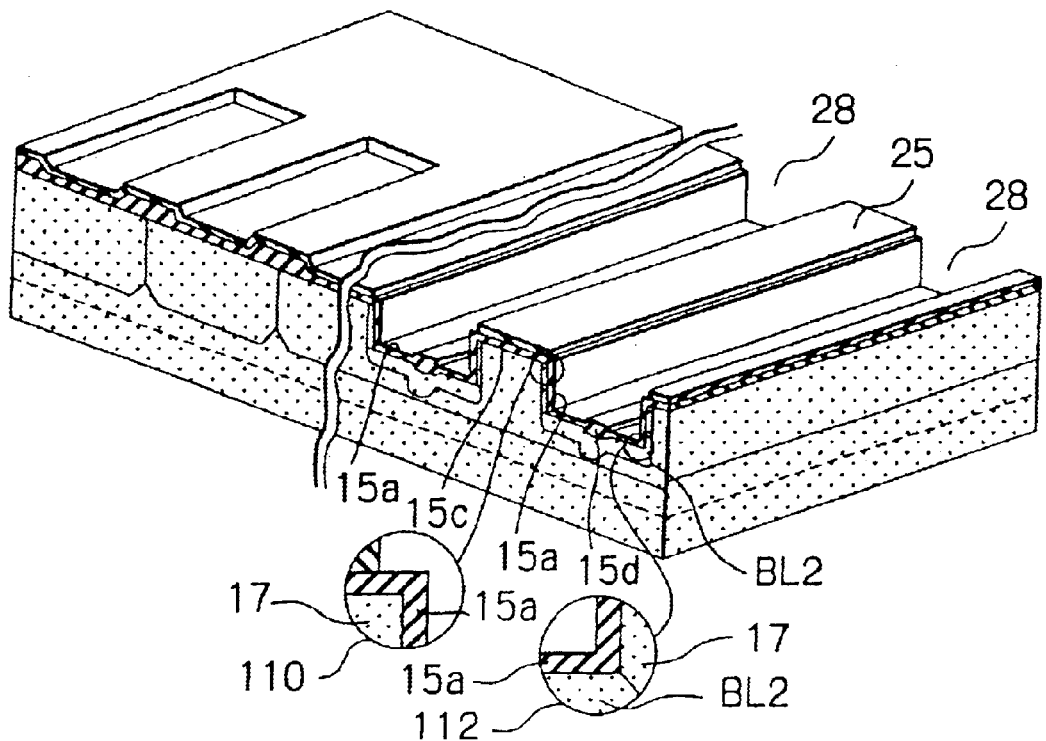

FIG. 20A shows a step to follow the step of FIG. 19B. As shown, the bottoms and sides of the trenches 28 are again oxidized to form tunnel insulation layers 15a which is about 5 nm thick. The tunnel insulation layers 15a should preferably be provided with desirable property because their property has critical influence on the device operation. For this purpose, the illustrative embodiment forms the tunnel insulation layers 19a by using plasma oxidation, which is implemented by a microwave excited, high density plasma device using a radial line slot antenna, and introducing a krypton (Kr) and oxygen (O$_2$) mixture gas in the plasma device.

In the plasma device mentioned above, Kr excited by a microwave hits against O$_2$ for thereby generating a great amount of atomic state oxygen O*. The atomic state oxygen O* easily enters the surface layers of the trenches 28 and oxidizes the bottoms and sides of the trenches 28 at substantially the same rate without regard to the plane direction. Consequently, the tunnel insulation layers 15a having uniform thickness are formed in the corner portions of the trenches 28, as indicated in an enlarged view in circles. For details of plasma oxidation, reference may be made to, e.g. Paper No. 29p-YC-4, The 48th Joint Meeting of Engineers of Applied Physics and Japanese patent laid-open publication No. 2001-160555.

Figure 20B:
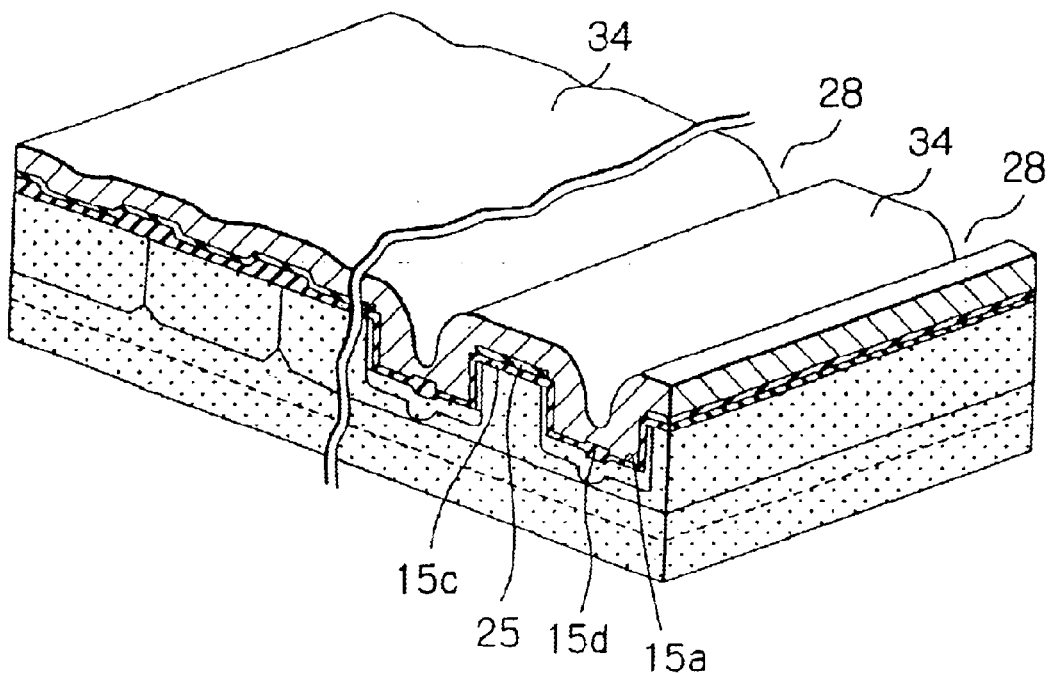

FIG. 20B shows a step to follow the step of FIG. 19B. As shown, the polycrystalline silicon layer or conductive layer 34, which is about 50 nm thick, is formed on the tunnel insulation layers 15a and silicon nitride layer 25. The polycrystalline silicon layer 34 is doped with phosphor (P) by an in-situ process beforehand.

Figure 21A:
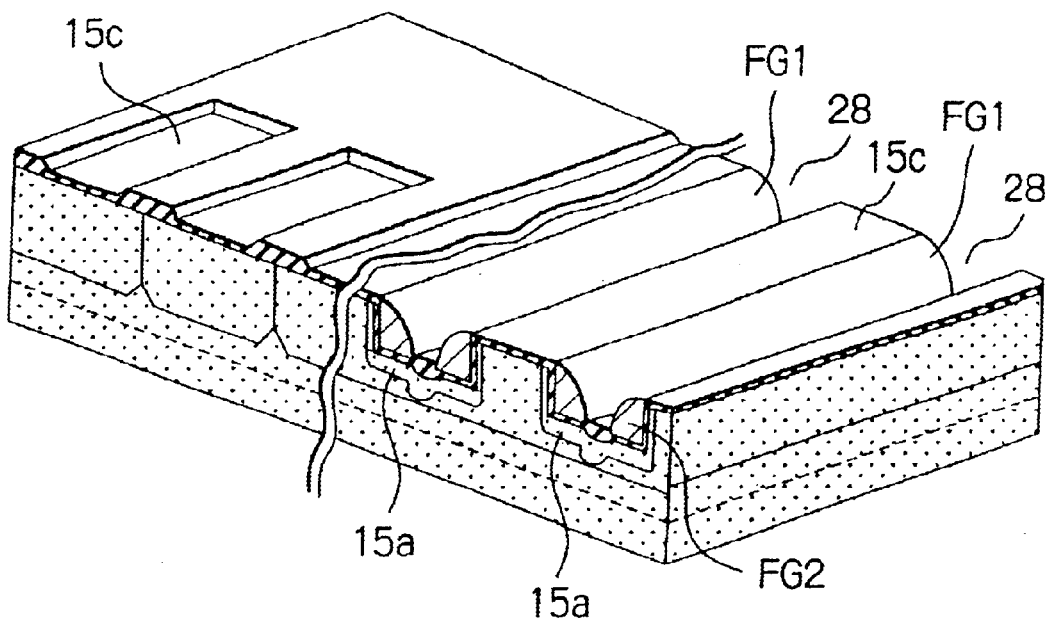

Subsequently, as shown in FIG. 21A, the polycrystalline silicon layer 34 is anisotropically etched in the direction of thickness. As a result, the polycrystalline silicon layer 34 on the tunnel insulation layers 15a is removed, but is left on the tunnel insulation layers 15a on the sides of the trenches 28. The polycrystalline silicon layers 34 on the sides of the trenches 28 constitute the floating gates FG1 and FG2. Thereafter, the silicon nitride layer 25 is removed by etching.

Figure 21B:
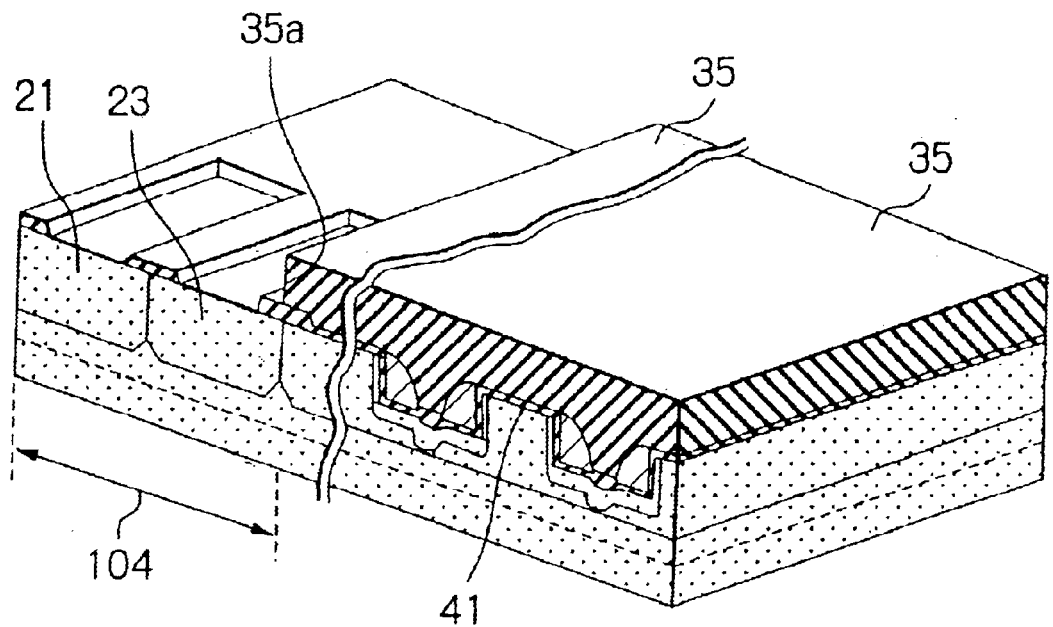

Subsequently, as shown in FIG. 21B, a photoresist layer 35 is coated on the entire surface of the laminate and then exposed and developed to form an aperture 35a in the CMOS transistor portion. Thereafter, the gate insulation layer 15c in the CMOS transistor portion is etched with the photoresist layer 35 serving as a mask, thereby causing the surfaces of the N type well 21 and P type well 23 to be exposed to the outside.

Figure 22A:
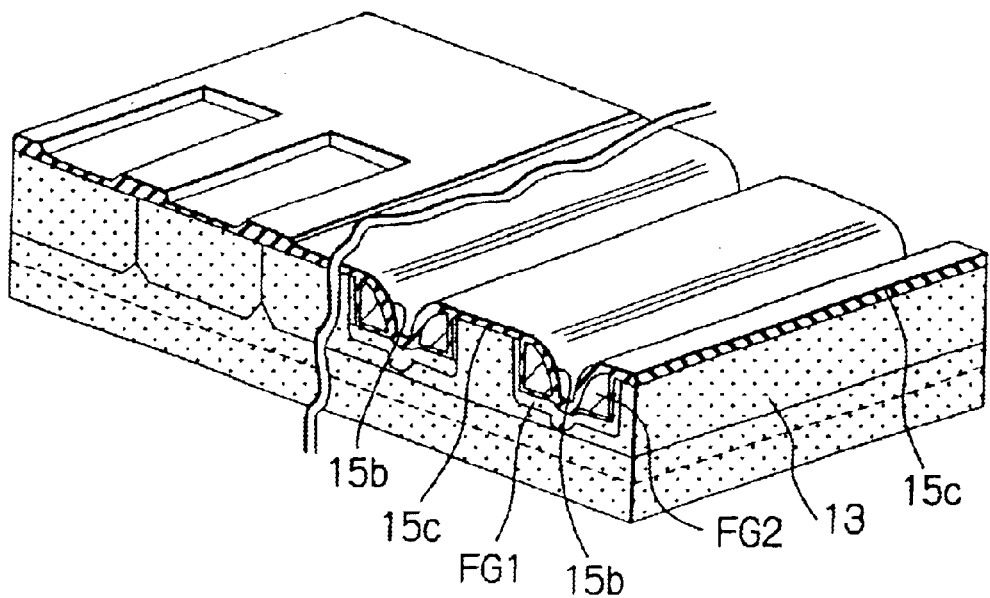

As shown in FIG. 22A, after the photoresist layer 35 has been removed, the entire exposed surface of the laminate is oxidized by plasma oxidation stated previously. This oxidizes silicon beneath the gate insulation layer 15c and thereby increases the thickness of the layer 15c. At the same time, the surfaces of the floating gates FG1 and FG2 are oxidized to form the inter-polycrystalline insulation layers 15b, which are about 8 nm thick each.

The floating gates FG1 and FG2 are formed of polycrystalline silicon, so that numerous crystal particles different in plane direction are formed on the surface of the floating gates FG1 and FG2. However, plasma oxidation allows a silicon oxide layer to be uniformly formed without regard to the plane direction, as stated earlier. This obviates an occurrence that the inter-polycrystalline insulation layer 15b is locally thinned and has its insulation characteristic deteriorated at thinner portions. This advantage is achievable even when polycrystalline silicon is doped with phosphor.

Figure 22B:
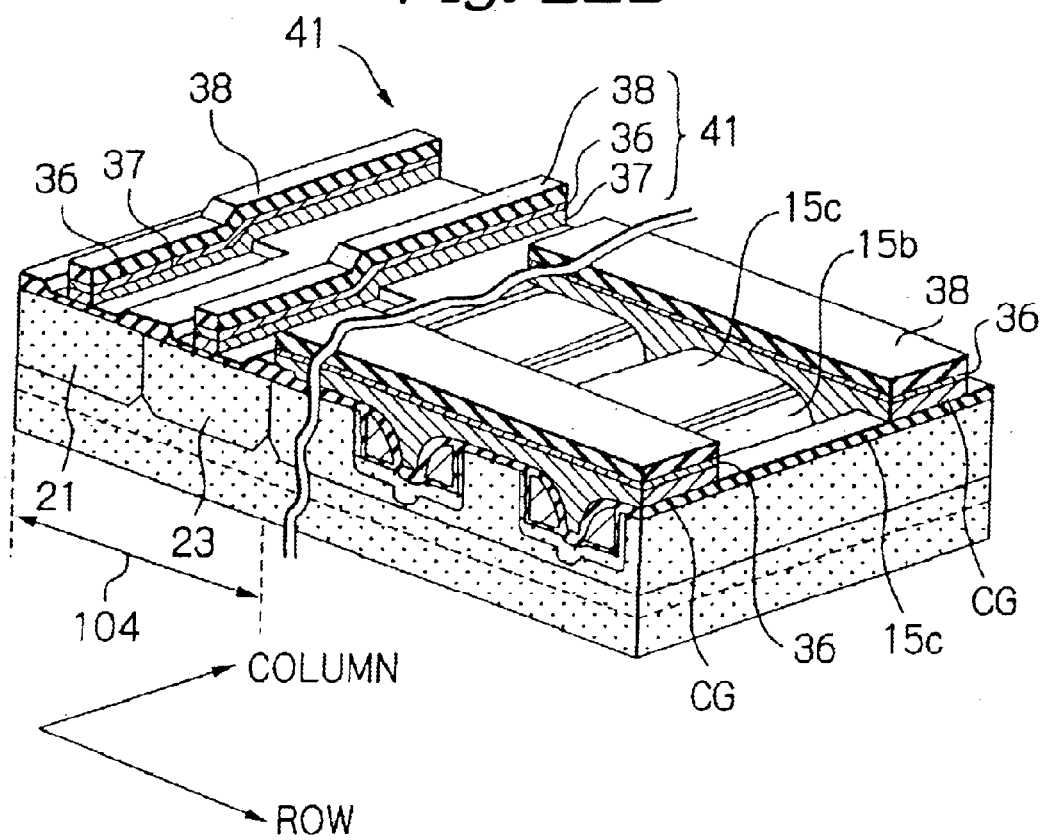

FIG. 22B shows a step to be executed after the step of FIG. 22A. As shown, a polycrystalline silicon layer, which is expected to constitute the control gate CG, is formed on the entire exposed surface of the laminate. The polycrystalline silicon layer is doped with phosphor by an in-situ process beforehand. Subsequently, a WSi layer 36 is formed on the polycrystalline silicon layer. Further, a cap layer 38 implemented as a silicon oxide layer is formed on the WSi layer 36. Thereafter, such layers lying one above the other are patterned to produce the structure shown in FIG. 22B.

By the step of FIG. 22B, a plurality of control gates CG are formed integrally with each other in the direction of row. At the same time, gate electrodes 41 are formed above the P type well 23 and N type well 21, respectively, which are included in the CMOS transistor portion. The gate electrodes 41 each are mainly implemented by the polycrystalline silicon layer 37 and have resistance thereof lowered by the WSi layer 36. The WSi layer 36 also present in each control gate CG lowers the resistance of the control gate CG as well.

Figure 23A:
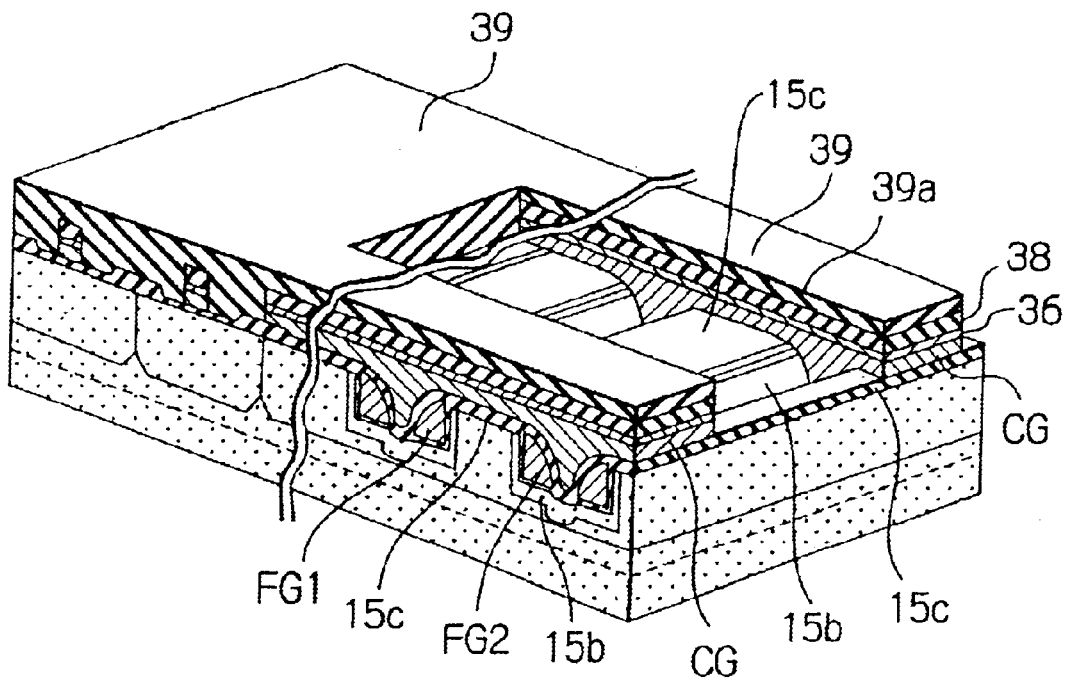
Figure 23B:
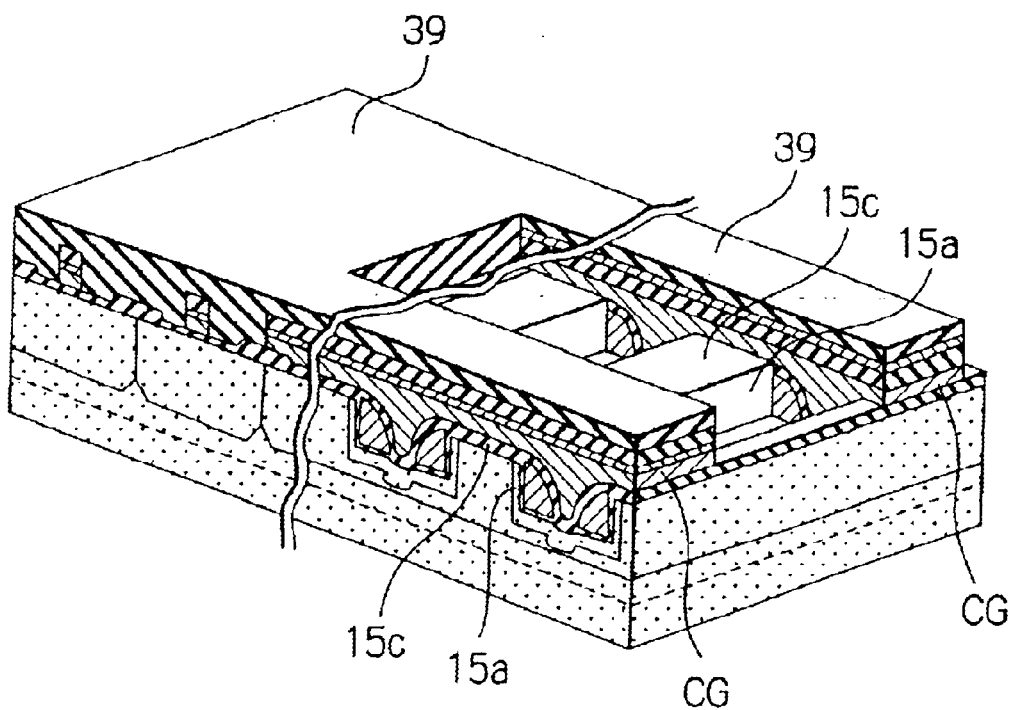

As shown in FIG. 23A, after the step of FIG. 22B, a photoresist layer 39 is coated on the entire surface of the laminate and then exposed and developed to form an aperture 39a between the adjoining control gates CG. Subsequently, as shown in FIG. 23B, the portions of the inter-polycrystalline insulation layers 15b not covered with the control gates CG are removed by etching with the photoresist layer 39 serving as a mask. At this instant, the gate insulation layers 15c between the control gates CG are slightly etched. Thereafter, the portions of the floating gates FG1 and FG2 not covered with the control gates CG are removed by etching using a different etchant. As a result, the tunnel insulation layers 15a are exposed to the outside between the adjoining control gates CG.

Figure 24:
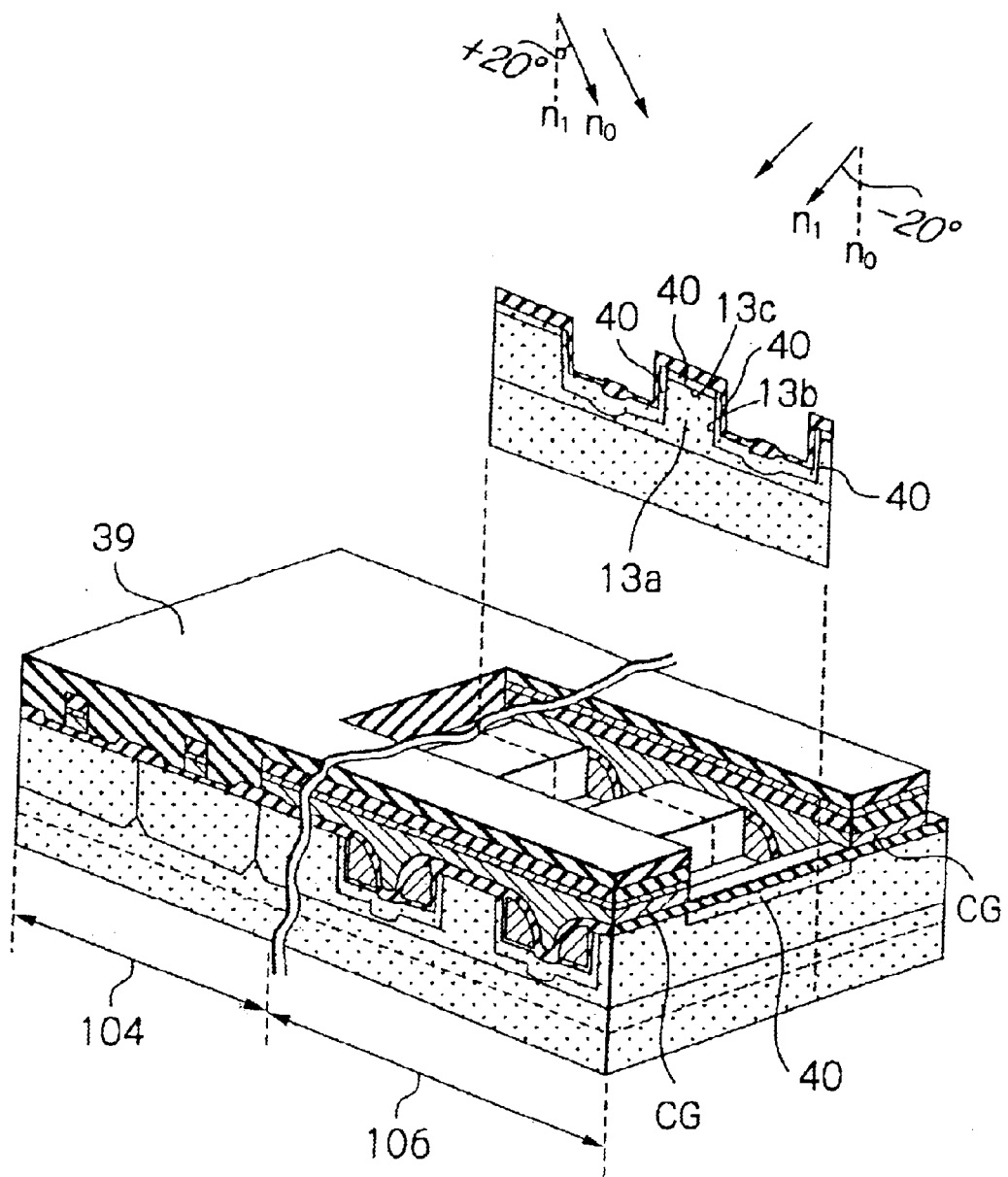

Finally, as shown in FIG. 24, isolation regions 40 are formed on the side walls 13b and top 13c of each projection 13a not covered with the control gates CG. While the side walls 13b and top 13c form a channel below the associated control gate CG, the isolation region 40 electrically isolates such channels below nearby control gates CG. To form the isolation regions 40, boron ions are implanted over the photoresist layer or mask 39. At this instant, the substrate 12 is tilted relative to the direction of implantation such that the isolation regions 40 are formed on the side walls 13b of the projections 13a. In the illustrative embodiment, the line $n_1$ normal to the P type silicon substrate 12 is tilted by about +/−20° relative to the direction of implantation $n_0$, as stated earlier. More specifically, $BF_2$, which is a seed, is implanted with acceleration energy of 20 keV in a dose of $1.0 \times 10^{13}$ cm$^{-2}$.

Subsequently, the photoresist layer 39 is removed to complete the semiconductor memory 10 shown in FIG. 1. The CMOS portion is completed with source/drain regions formed at preselected positions.

As stated above, the illustrative embodiment implements a multiple-bit transistor operable with a lower write-in voltage than the conventional multiple-bit transistor, a semiconductor memory using the same, and a method of driving a multiple-bit transistor.

Figure 31:
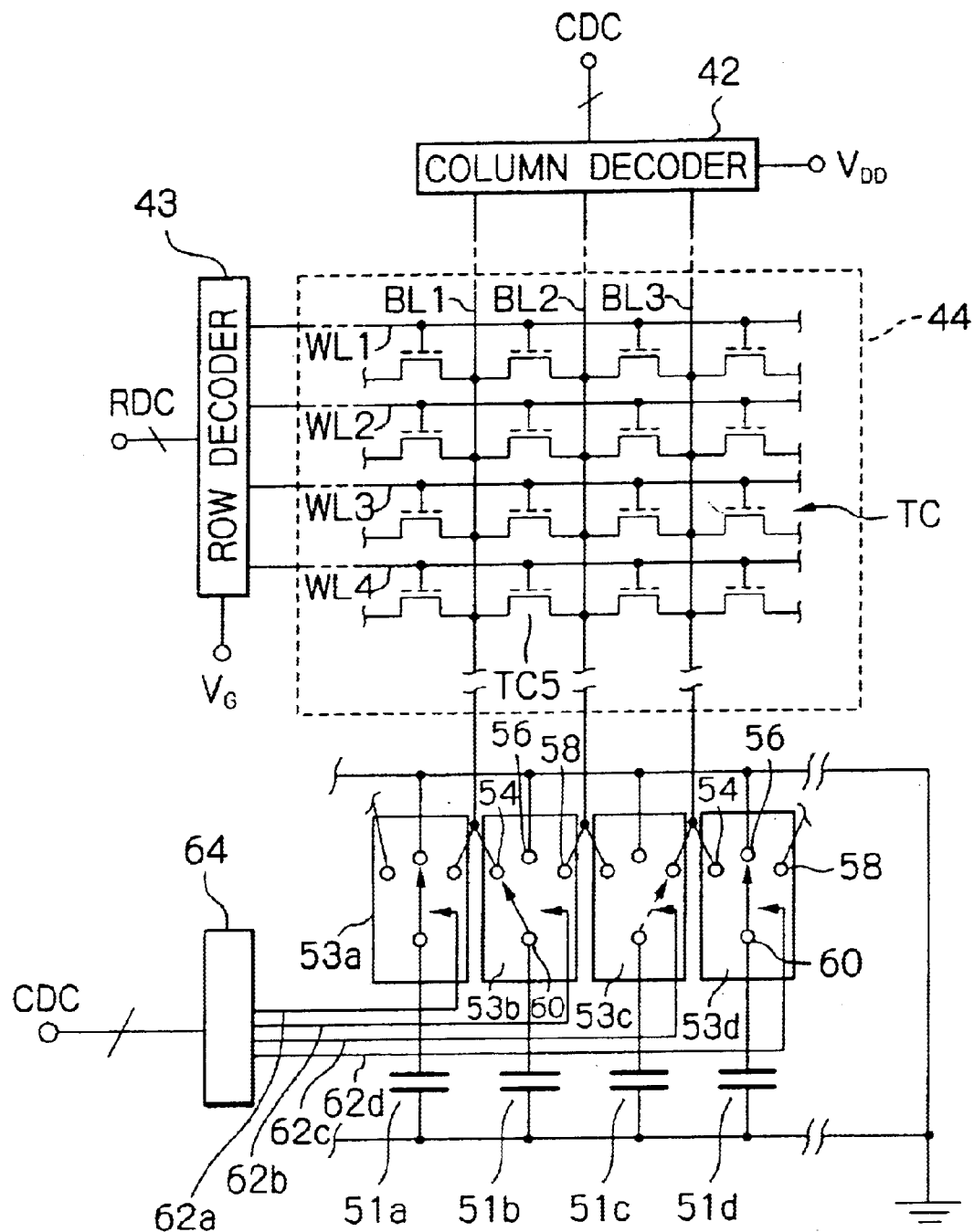
FIG. 31 is a schematic circuit diagram useful for understanding a method writing data in accordance with an alternative embodiment of the present invention.

Reference will be made to FIGS. 31 and 32 for describing an alternative embodiment of the present invention using a constant-charge type of writing system. A constant-charge type of writing system includes a capacitor connected to either one of opposite source/drain regions. A write current is caused to flow between the source/drain regions until the capacitor stores or releases a preselected amount of charge, so that a charge is ballistically injected into at least one of two floating gates. The illustrative embodiment shown in FIG. 31 is constructed to cause the write current to flow until the capacitor releases a preselected amount of charge.

More specifically, in the illustrative embodiment, the bit lines BL1 and BL2 are respectively connected to the source and drain electrodes of a cell transistor TC5, so that electrons are stored in the floating gate FG connected to the drain electrode of the transistor TC5, i.e. the bit line BL2. A capacitor 51b is connected to the bit line BL1 via a switch portion 53b. A column decoder 42 applies, e.g. 5V to the bit line BL2 as a write voltage. The capacitor 51b has one of its opposite terminals grounded, which is not connectable to the bit line BL1. Before a writing sequence begins, the opposite terminals of the capacitor 51b are grounded to empty the capacitor 51b. In the illustrative embodiment the capacitor 51b and other capacitors 51a, 51c and 51d each are assigned to a particular column although each of them may be assigned to a plurality of columns.

On the start of a writing sequence, electrons, forming a write current, flow from the capacitor 51b to the drain electrode of the cell transistor TC5 via the source electrode of the transistor TC5. As a result, the electrons are stored in the floating gate FG of the cell transistor TC5 connected to the drain electrode, i.e. the bit line BL2 while a positive charge is stored in the capacitor 51b. On the elapse of a preselected period of time, the potential difference between the opposite terminals of the capacitor 51b varies to, e.g. about 1.5 V with the result that the potential difference between the source and drain electrodes of the cell transistor TC5 is lowered from the initial 5 V to about 3.5 V. The write current therefore stops flowing, i.e. the writing sequence ends.

The illustrative embodiment will be described more specifically hereinafter. First, the configuration of the switch portion 53b will be described in detail. It is to be noted that the remaining switch portions 53a, 53c and 53d are identical in configuration with the switch portion 53b. The switch portion 53b has terminals 54, 58, 56 and 60 connected to the bit lines BL1 and BL2, ground and one terminal of the capacitor 51b, respectively. The other terminal of the capacitor 51b is grounded. This way of connection is also correspondingly applied to the remaining switch portions 53a, 53c and 53d, and the remaining capacitors 51a, 51c and 51d. Capacitor control signals 62a, 62b, 62c and 62d are respectively connected to the switch portions 53a, 53b, 53c and 53d, and each causes the associated terminal 60 to be selectively connected to one of the terminals 54, 56 and 58.

The function of the capacitor control signals 62a through 62d will be described hereinafter. Before write-in begins, the capacitor control signals 62a through 62d maintain the terminals 60 of the switch portions 53a through 53d connected to the terminals 56. In this condition, a potential difference between the opposite terminals of each of the capacitors 51a through 51d is 0 V, i.e. all of the capacitors are empty.

Assume that the cell transistor TC5 is selected in the write mode, and that the bit line BL1 of the transistor TC5 should be connected to the capacitor 51b. Then, the capacitor control signal 62b causes the terminal 60 of the switch portion 53b to be connected to the associated terminal 54, but the other capacitor control signals 62a, 62c and 62d maintain the terminals 60 of the switch portions 53a, 53c and 53d connected to the terminals 56. When write-in ends in a preselected period of time, the capacitor control signal 62b brings the terminal 60 of the switch portion 53b into connection with the terminal 56.

The capacitor control signals 62a through 62d are generated by a capacitor controller 64 in response to the column decode signal CDC stated earlier.

Figure 32A:
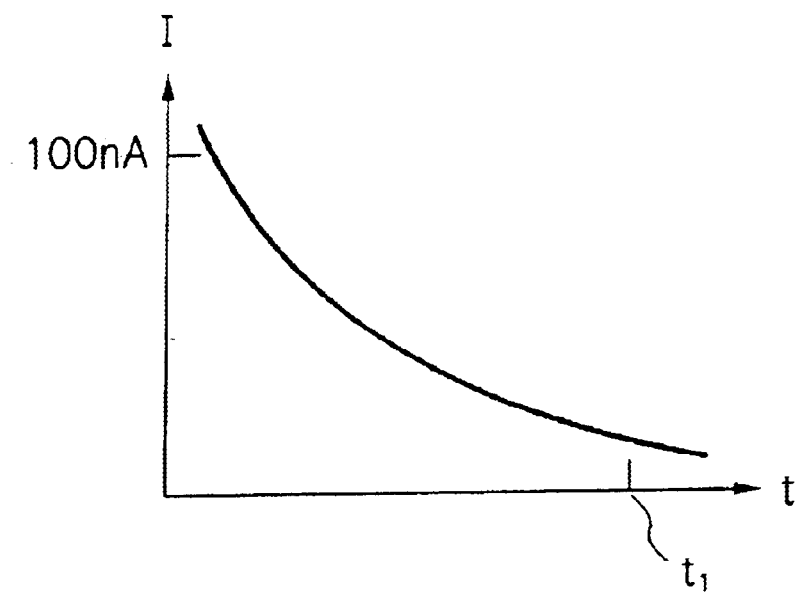
FIGS. 32A and 32B plot curves representative of a current and a voltage, respectively, appearing in the alternative embodiment during write mode operation.
Figure 32B:
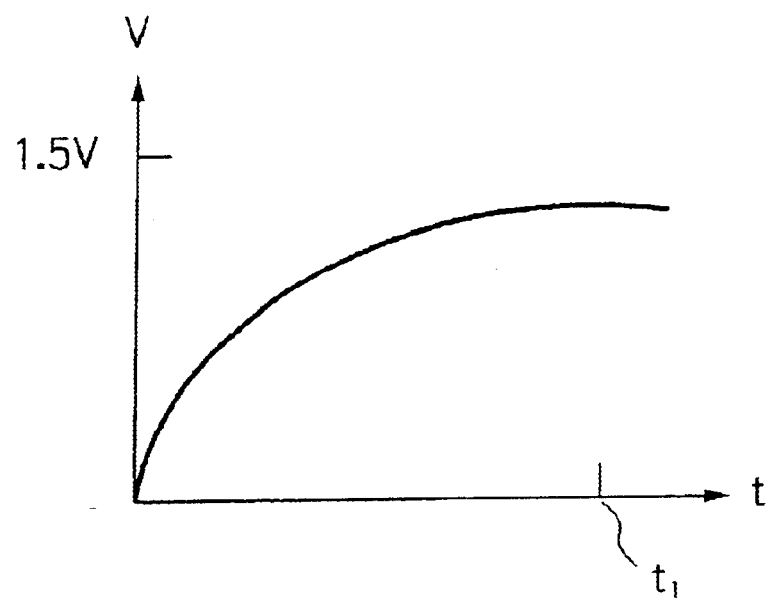

FIGS. 32A and 32B plot curves respectively showing a current flowing between the source and drain electrodes of the cell transistor TC5 and a voltage appearing between the opposite terminals of the capacitor 51b in the write mode. In FIG. 32A, the ordinate and abscissa respectively indicate a current and a period of time elapsed since the start of writing operation; a time $t_1$ is 100 nsec by way of example. As shown, the current has the maximum value, which is about 100 nA, at the beginning of writing operation and then sequentially decreases with the elapse of time. The writing operation ends before the time $t_1$.

In FIG. 32B, the ordinate and abscissa respectively indicate a voltage and a period of time elapsed since the start of the writing operation; the time $t_1$ is also 100 nsec by way of example. As shown, the voltage is 0 V at the beginning of the writing operation and then sequentially rises with the elapse of time until it settles at, in the illustrative embodiment, 1.5 V or below. Because the voltage of 5 V is applied to the drain electrode of the cell transistor TC5, a voltage of 3.5 V or above is applied between the source and drain electrodes of the transistor TC5.

When the tunnel insulation layers 15a are formed of silicon oxide, the potential barrier of the layers 15a is 3.2 V. Therefore, the voltage of 3.5 between the source and drain electrodes of the cell transistor TC5 is higher than the potential barrier. Moreover, as FIG. 32B indicates, the voltage of 3.5 V or above is continuously applied over the entire writing period. The voltage of 3.5 V or above applied between the source and drain electrodes allows electrons to be efficiently injected into the floating gate and lowers the required write current. Consequently, data can be written into a plurality of cell transistors at the same time and therefore at high speed in entirety.

The constant-charge type of writing system described above is advantageous over a constant-voltage type of writing system in the following respect. A constant-voltage type of writing system applies a constant voltage between the source and drain electrodes and therefore does not control the value of the write current, so that the write current sometimes increase to 100 iA or above. The current of 100 iA is excessively great as a write current and obstructs parallel, simultaneous writing of data in a plurality of cell transistors.

The constant-current type of writing system may be modified to cause a constant current smaller than a preselected value to flow between the source and drain electrodes, implementing an improved constant-voltage type of writing system. However, in the constant-current type of writing system, a constant current of about 100 nA cannot continuously flow throughout the writing period unless the voltage applied to the drain electrode is sequentially raised above the initial voltage, e.g. 5 V up to, e.g. about 8V with the elapse of time. The voltage of about 8V is necessary in the constant-current type of writing system because a charge having accumulated in the floating gate from the beginning of the writing operation requires the voltage applied to the drain electrode to be raised in order to maintain the voltage between the source and drain electrodes at or above 3.2 V, i.e. to efficiently inject electrons.

By contrast, in the constant-charge type of writing system, despite that the drain voltage is fixed at, e.g. 5 V, the voltage between the opposite terminals of the capacitor is as low as 0 V at the initial stage of writing, as shown in FIGS. 32A and 32B. This voltage remains as low as about 1.5 V even at the final stage of writing, insuring efficient writing.

The description with reference to FIG. 31 has concentrated on the case wherein electrons are stored in the floating gate FG of the transistor TC5 connected to the bit line BL2. To store electrons in the other floating gate FG connected to the bit line BL1, the terminal 60 should only be connected to the terminal 58.

Also, in FIG. 31, a positive voltage, e.g. 5 V is applied to the drain electrode of the cell transistor TC5. Alternatively, an arrangement may be made such that electrons are stored, before the start of write-in, in the capacitor 51b to be connected to the source electrode to thereby make the potential of the capacitor 51b negative, and then the capacitor 51b is connected to the source electrode on the start of write-in for thereby releasing the electrons from the source to the drain electrode. This is also successful to store electrons in the floating gate of the cell transistor TC5 connected to the bit line BL2.

Further, in FIG. 31, the capacitor 51b is connected to the source electrode in order to store electrons in the floating gate FG connected to the drain electrode. Alternatively, the capacitor 51b may be connected to the drain electrode so as to store electrons in the floating gate FG connected to the drain electrode. This can be done if a positive charge is stored in the capacitor 51b, and then the capacitor 51b and source electrode are connected to the drain electrode and ground, respectively. In this case also, electrons flow from the source electrode or bit line BL1 to the drain electrode or bit line BL2 and are therefore stored in the floating gate FG connected to the drain electrode.

While in the illustrative embodiments P and N types are respectively referred to as one-conductivity and counter-conductivity types, N and P types may, of course, be used as one-conductivity and counter-conductivity types, respectively.

As stated above, the illustrative embodiment sets up, in a write mode, a potential difference for the write mode between the source/drain regions of the cell transistor while applying a write voltage to the control gate. As a result, a channel is formed on the surfaces of opposite side walls and top of the projection and allows a carrier flowing on the top of the projection to be injected into a floating gate straightforward without being steered at all. This successfully lowers a required write voltage. Also, by applying the constant-charge type of writing system, the illustrative embodiment can write data efficiently, i.e. with a minimum of write current.

On the other hand, in a read mode, a potential difference for the read mode is set up between the source/drain regions of the transistor while a read voltage is applied to the control gate to thereby cause a first drain current $I_{d1}$ to flow. Subsequently, the potential difference for the read mode is inverted to cause a second drain current $I_{d2}$ to flow. The potential of the floating gate is pulled toward the potential of the source/drain regions and control gate due to capacitances between the floating gate and the source/drain regions, and that between the floating gate and the control gate. It is therefore possible to increase or decrease the drain currents $I_{d1}$ and $I_{d2}$ to desired values and therefore to widen a current window.

The entire disclosure of Japanese patent application Nos. 2001-358308 and 2002-319835 filed on Nov. 22, 2001, and Nov. 1, 2002, respectively, including the specification, claims, accompanying drawings and abstract of the disclosure is incorporated herein by reference in its entirety.

While the present invention has been described with reference to the particular illustrative embodiments, it is not to be restricted by the embodiments. It is to be appreciated that those skilled in the art can change or modify the embodiments without departing from the scope and spirit of the present invention.

What is claimed is:

1. A transistor comprising:
   a one-conductivity type semiconductor substrate formed with a projection having a pair of side walls facing each other;
   a first insulation layer formed on a top of the projection;
   a pair of counter-conductivity type source/drain regions formed on a surface of said semiconductor substrate at opposite sides of the projection;
   second insulation layers each covering one of the pair of side walls of the projection and one of said pair of source/drain regions adjoining the side wall;
   a pair of floating gates respectively formed on the pair of side walls of the projection and facing said pair of side walls and said pair of source/drain regions via respective second insulation layers;
   third insulation layers each being formed on one of said pair of floating gates; and
   a control gate facing said pair of floating gates via said third insulation layers and facing the top of the projection via said first insulation layer;
   a potential difference for write-in being set up between said pair of source/drain regions while a write voltage is applied to said control gate, thereby causing a charge to be ballistically injected into at least one of said pair of floating gates.

2. The transistor in accordance with claim 1, wherein a charge to flow between said source/drain regions comprises electrons, the electrons obtaining energy greater than a potential barrier of said second insulation layers and being ballistically injected into at least one of said floating gates.

3. The transistor in accordance with claim 1, wherein a first capacitance is formed by said floating gates each facing one side wall of the projection and one of said source/drain regions via a particular one of said second insulation layers, a second capacitance being formed by said control gate facing the top of the projection via said first insulation layer, the first capacitance being greater than the second capacitance.

4. The transistor in accordance with claim 1, wherein a first capacitance is formed by said floating gates each facing one side wall of the projection and one of said source/drain regions via a particular one of said second insulation layers, a third capacitance being formed by each of said floating gates facing said control gate via one of said third insulation layers, the first capacitance being capacitively coupled to the third capacitance, the first capacitance being great.

5. The transistor in accordance with claim 1, wherein counter-conductivity type regions each are formed on one of the side walls of the projection in contact with the source/drain region adjoining the side wall.

6. The transistor in accordance with claim 1, wherein each of said floating gates at least partly protrudes above the top of the projection.

7. The transistor in accordance with claim 1, wherein said floating gates are configured such that said floating gates do not cover the top of the projection.

8. A semiconductor memory comprising a plurality of cell transistors arranged in a direction of column and a direction of row, each of said plurality of cell transistors comprising:
   a one-conductivity type semiconductor substrate formed with a projection having a pair of side walls facing each other;
   a first insulation layer formed on a top of the projection;
   a pair of counter-conductivity type source/drain regions formed on a surface of said semiconductor substrate at opposite sides of the projection;
   second insulation layers each covering one of the pair of side walls of the projection and one of said pair of source/drain regions adjoining the side wall;
   a pair of floating gates respectively formed on the pair of side walls of the projection and facing said pair of side walls and said pair of source/drain regions via respective second insulation layers;
   third insulation layers each being formed on one of said pair of floating gates; and
   a control gate facing said pair of floating gates via said third insulation layers and facing the top of the projection via said first insulation layer;
   a potential difference for write-in being set up between said pair of source/drain regions while a write voltage is applied to said control gate, thereby causing a charge to be ballistically injected into at least one of said pair of floating gates.

9. The memory in accordance with claim 8, wherein ones of said plurality of cell transistors adjoining each other in the direction of column share a single source/drain region,
   ones of said plurality of cell transistors adjoining each other in the direction of row sharing a single control gate and said source/drain region between said cell transistors.

10. The memory in accordance with claim 8, wherein the projection has a root portion defined by a straight line virtually connecting said pair of source/drain regions, the root portion being higher in concentration of the one-conductivity type impurity than a remaining portion of the projection.

11. The memory in accordance with claim 10, wherein a charge to flow between said source/drain regions comprises electrons, the electrons obtaining energy greater than a potential barrier of said second insulation layers and being ballistically injected into at least one of said floating gates.

12. The memory in accordance with claim 10, wherein a first capacitance is formed by said floating gates each facing one side wall of the projection and one of said source/drain regions via a particular one of said second insulation layers, a second capacitance being formed by said control gate facing the top of the projection via said first insulation layer, the first capacitance being greater than the second capacitance.

13. The memory in accordance with claim 10, wherein a first capacitance is formed by said floating gates each facing one side wall of the projection and one of said source/drain regions via particular one of said second insulation layers, a third capacitance being formed by each of said floating gates facing said control gate via one of said third insulation layers, the first capacitance being capacitively coupled to the third capacitance, the first capacitance being great.

14. The memory in accordance with claim 10, wherein counter-conductivity type regions each are formed on one of the side walls of the projection in contact with the source/drain region adjoining the side wall.

15. The memory in accordance with claim 10, wherein each of said floating gates at least partly protrudes above the top of the projection.

16. The memory in accordance with claim 10, wherein said floating gates are configured such that said floating gates do not cover the top of the projection.

17. A semiconductor memory comprising a plurality of cell transistors arranged in a direction of column and a direction of row, each of said plurality of cell transistors comprising:

a one-conductivity type semiconductor substrate formed with a projection having a pair of side walls facing each other;

a first insulation layer formed on a top of the projection;

a pair of counter-conductivity type source/drain regions formed on a surface of said semiconductor substrate at opposite sides of the projection;

second insulation layers each covering one of the pair of side walls of the projection and one of said pair of source/drain regions adjoining the side wall;

a pair of floating gates respectively formed on the pair of side walls of the projection and facing said pair of side walls and said pair of source/drain regions via respective second insulation layers;

third insulation layers each being formed on one of said pair of floating gates; and a control gate facing said pair of floating gates via said third insulation layers and facing the top of the projection via said first insulation layer;

the projection having a root portion defined by a straight line virtually connecting said pair of source/drain regions, the root portion being higher in concentration of the one-conductivity type impurity than a remaining portion of the projection, a potential difference for write-in being set up between said pair of source/drain regions while a write voltage is applied to said control gate, thereby causing a charge to be ballistically injected into at least one of said pair of floating gates.

18. The memory in accordance with claim 17, wherein ones of said plurality of cell transistors adjoining each other in the direction of column share a single source/drain region, ones of said cell transistors adjoining each other in the direction of row sharing a single control gate and the source/drain region between said cell transistors.

19. A transistor comprising:

a one-conductivity type semiconductor substrate formed with a projection having a pair of side walls facing each other;

a first insulation layer formed on a top of the projection;

a pair of counter-conductivity type source/drain regions formed on a surface of said semiconductor substrate at opposite sides of the projection;

second insulation layers respectively each covering one of the pair of side walls of the projection and one of said pair of source/drain regions adjoining the side wall;

a pair of floating gates respectively formed on the pair of side walls of the projection and facing said pair of side walls and said pair of source/drain regions via respective second insulation layer;

third insulation layers each being formed on one of said pair of floating gates;

a control gate facing said pair of floating gates via said third insulation layers and facing the top of the projection via said first insulation layer; and a capacitor selectively connectable to either one of said pair of source/drain regions;

a write current being caused to continuously flow between said pair of source/drain regions until a preselected amount of charge has been stored in or released from said capacitor, thereby causing a charge to be ballistically charged into at least one of said pair of floating gates.

20. The transistor in accordance with claim 19, wherein the current to flow between said source/drain regions comprises electrons, the electrons obtaining energy greater than a potential barrier of said second insulation layers and being ballistically injected into at least one of said floating gates.

21. The transistor in accordance with claim 19, wherein a first capacitance is formed by said floating gates respectively facing the side walls of the projection and said source/drain regions via said second insulation layers, a second capacitance being formed by said control gate facing the top of the projection via said first insulation layer, the first capacitance being greater than the second capacitance.

22. The transistor in accordance with claim 19, wherein a first capacitance is formed by said floating gates respectively facing the side walls of the projection and said source/drain regions via said second insulation layers, a third capacitance being formed by said floating gates facing said control gate via said third insulation layers, the first capacitance being capacitively coupled with the third capacitance, the first capacitance being great.

23. The transistor in accordance with claim 19, wherein counter-conductivity type regions are formed on respective side walls of the projection in contact with said source/drain regions adjoining said side walls.

24. The transistor in accordance with claim 19, wherein each of said floating gates at least partly protrudes above the top of the projection.

25. The transistor in accordance with claim 19, wherein said floating gates are configured such that said floating gates do not cover the top of the projection.

26. A semiconductor memory comprising a plurality of cell transistors arranged in a direction of column and a direction of row, each of said plurality of cell transistors comprising:

a one-conductivity type semiconductor substrate formed with a projection having a pair of side walls facing each other;

a first insulation layer formed on a top of the projection;

a pair of counter-conductivity type source/drain regions formed on a surface of said semiconductor substrate at opposite sides of the projection;

second insulation layers each covering one of the pair of side walls of the projection and one of said pair of source/drain regions adjoining the side wall;

a pair of floating gates respectively formed on the pair of side walls of the projection and facing said pair of side walls and said pair of source/drain regions via respective second insulation layers;

third insulation layers each being formed on one of said pair of floating gates;

a control gate facing said pair of floating gates via said third insulation layers and facing the top of the projection via said first insulation layer; and a capacitor selectively connectable to either one of said pair of source/drain regions;

a write current being caused to continuously flow between said pair of source/drain regions until a preselected amount of charge has been stored in or released from said capacitor, thereby causing a charge to be ballistically charged into at least one of said pair of floating electrodes.

27. The memory in accordance with claim 26, wherein ones of said plurality of cell transistors adjoining each other in the direction of column share a single source/drain region, ones of said plurality of cell transistors adjoining each other in the direction of row sharing a single control gate and the source/drain region between said cell transistors.

28. A method of driving a transistor, comprising the steps of:
preparing a transistor comprising:
  a one-conductivity type semiconductor substrate formed with a projection having a pair of side walls facing each other;
  a first insulation layer formed on a top of the projection;
  a pair of counter-conductivity type source/drain regions formed on a surface of said semiconductor substrate at opposite sides of the projection;
  second insulation layers each covering one of the side pair of walls of the projection and one of said pair of source/drain regions adjoining the side wall;
  a pair of floating gates respectively formed on the pair of side walls of the projection and facing said pair of side walls and said pair of source/drain regions via respective second insulation layer;
  third insulation layers each being formed on one of said pair of floating gates; and
  a control gate facing said pair of floating gates via said third insulation layers and facing the top of the projection via said first insulation layer;
setting up a potential difference for write-in between said pair of source/drain regions;
applying a write voltage to said control gate; and
ballistically injecting a charge into at least one of said pair of floating gates for thereby writing data in said at least one floating gate.

29. The method in accordance with claim 28, wherein a root portion of the projection, which is defined by a straight line virtually connecting said pair of source/drain regions, is higher in concentration of the one-conductivity type impurity than a remaining portion of the projection.

30. The method in accordance with claim 29, further comprising the steps of:
setting up a potential difference for read-out between said source/drain regions and applying a read voltage to said control gate to cause a first drain current to flow;
reversing the potential difference for read-out and applying the read voltage to said control gate to cause a second drain current to flow; and
distinguishing charges stored in said floating gates on a basis of a value of said first drain current and a value of the second drain current.

31. The method in accordance with claim 28, further comprising the steps of:
setting up a potential difference for read-out between said source/drain regions and applying a read voltage to said control gate to cause a first drain current to flow;
reversing the potential difference for read-out and applying the read voltage to said control gate to cause a second drain current to flow; and
distinguishing charges stored in said floating gates on basis of a value of the first drain current and a value of the second drain current.

* * * * *